US011777025B2

United States Patent
Kobayashi et al.

(10) Patent No.: US 11,777,025 B2
(45) Date of Patent: Oct. 3, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Yusuke Kobayashi, Nagareyama (JP); Tatsunori Sakano, Shinagawa (JP); Hiro Gangi, Ota (JP); Tomoaki Inokuchi, Yokohama (JP); Takahiro Kato, Yokohama (JP); Yusuke Hayashi, Yokohama (JP); Ryohei Gejo, Kawasaki (JP); Tatsuya Nishiwaki, Komatsu (JP)

(73) Assignees: KABUSHIKA KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 192 days.

(21) Appl. No.: 17/170,962

(22) Filed: Feb. 9, 2021

(65) Prior Publication Data
US 2021/0391458 A1    Dec. 16, 2021

(30) Foreign Application Priority Data
Jun. 12, 2020   (JP) .................. 2020-102245

(51) Int. Cl.
*H01L 29/78* (2006.01)
*H01L 29/10* (2006.01)
(Continued)

(52) U.S. Cl.
CPC ........ *H01L 29/7813* (2013.01); *H01L 21/765* (2013.01); *H01L 29/1095* (2013.01);
(Continued)

(58) Field of Classification Search
CPC ............... H01L 29/407; H01L 29/7813; H01L 29/0696; H01L 29/42368
See application file for complete search history.

(56) References Cited

U.S. PATENT DOCUMENTS

| 5,016,070 A | 5/1991 | Sundaresan |
|---|---|---|
| 8,614,483 B2 | 12/2013 | Tanabe et al. |

(Continued)

FOREIGN PATENT DOCUMENTS

| JP | 3-259568 A | 11/1991 |
|---|---|---|
| JP | 2865285 B2 | 3/1999 |

(Continued)

*Primary Examiner* — Samuel A Gebremariam
*Assistant Examiner* — Jonas T Beardsley
(74) *Attorney, Agent, or Firm* — Oblon, McClelland, Maier & Neustadt, L.L.P.

(57) ABSTRACT

According to one embodiment, a semiconductor device includes a semiconductor member, first and second electrodes, a gate electrode, a gate terminal, a first conductive member, a first terminal, and a first insulating member. The semiconductor member includes first and second semiconductor regions, and a third semiconductor region provided between the first and second semiconductor regions. The first electrode is electrically connected to the first semiconductor region. The second electrode is electrically connected to the second semiconductor region. The gate terminal is electrically connected to the gate electrode. The first conductive member is electrically insulated from the first and second electrodes, and the gate electrode. The first terminal is electrically connected to the first conductive member. The first insulating member includes a first insulating region between the third semiconductor region and the gate electrode, and a second insulating region between the gate electrode and the first conductive member.

4 Claims, 27 Drawing Sheets

(51) Int. Cl.
  *H01L 29/417* (2006.01)
  *H01L 29/66* (2006.01)
  *H01L 21/765* (2006.01)
  *H01L 29/40* (2006.01)

(52) U.S. Cl.
  CPC ...... *H01L 29/407* (2013.01); *H01L 29/41741* (2013.01); *H01L 29/66727* (2013.01); *H01L 29/66734* (2013.01)

(56) References Cited

U.S. PATENT DOCUMENTS

| | | | |
|---|---|---|---|
| 2006/0209586 A1* | 9/2006 | Hirler | H01L 29/7811 257/E29.133 |
| 2012/0061722 A1 | 3/2012 | Hashimoto et al. | |
| 2016/0064546 A1* | 3/2016 | Zitouni | H01L 29/4236 257/334 |
| 2018/0061998 A1* | 3/2018 | Padmanabhan | H01L 29/66924 |

FOREIGN PATENT DOCUMENTS

| | | |
|---|---|---|
| JP | 3386574 B2 | 3/2003 |
| JP | 2012-138567 A | 7/2012 |
| JP | 5674530 B2 | 2/2015 |

\* cited by examiner

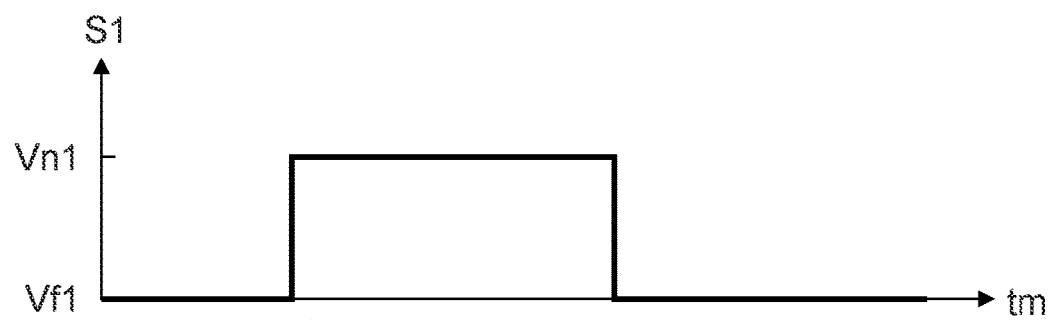
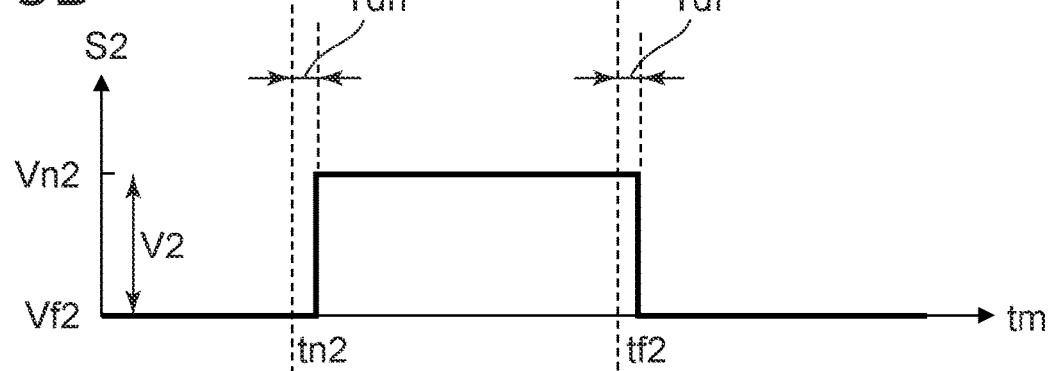
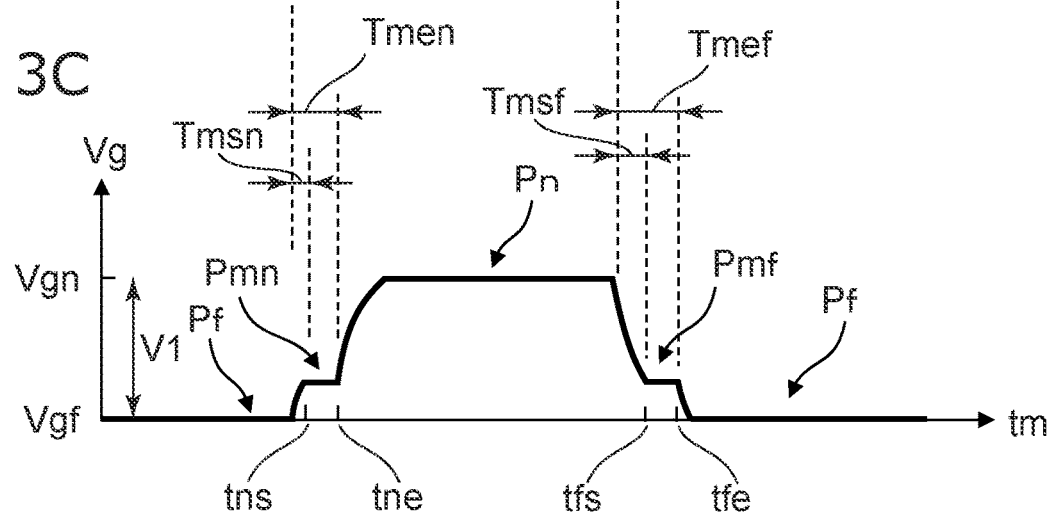

US 11,777,025 B2

SEMICONDUCTOR DEVICE

CROSS-REFERENCE TO RELATED APPLICATIONS

This application is based upon and claims the benefit of priority from Japanese Patent Application No. 2020-102245, filed on Jun. 12, 2020; the entire contents of which are incorporated herein by reference.

FIELD

Embodiments described herein generally relate to a semiconductor device.

BACKGROUND

For example, it is desirable to improve the characteristics of a semiconductor device such as a transistor or the like.

BRIEF DESCRIPTION OF THE DRAWINGS

FIGS. 3A to 3C are schematic views illustrating an operation of the semiconductor device according to the first embodiment;

DETAILED DESCRIPTION

Figure 1:
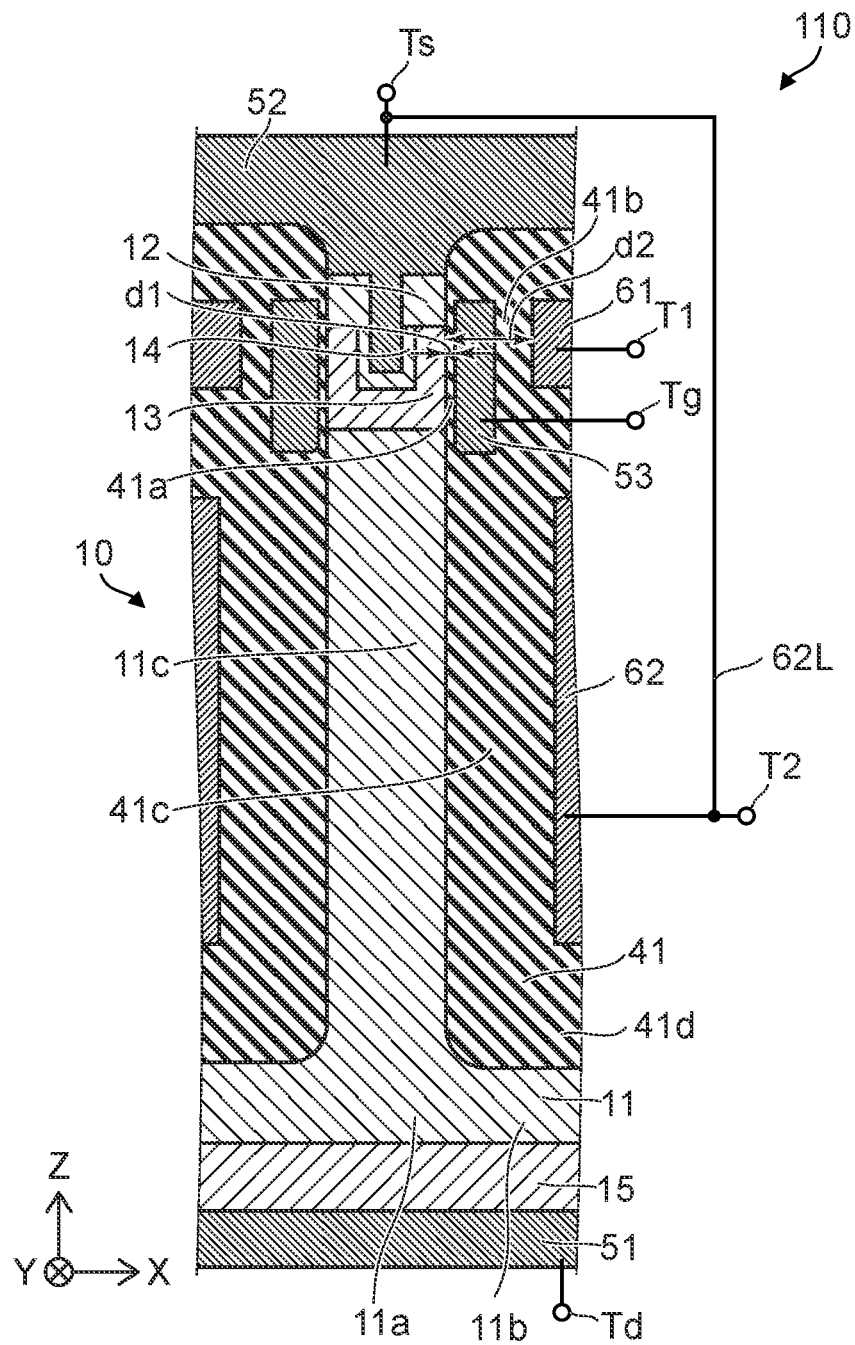
FIG. 1 is a schematic cross-sectional view illustrating a semiconductor device according to a first embodiment.

According to one embodiment, a semiconductor device includes a semiconductor member, a first electrode, a second electrode, a gate electrode, a gate terminal, a first conductive member, a first terminal, and a first insulating member. The semiconductor member includes a first semiconductor region of a first conductivity type, a second semiconductor region of the first conductivity type, and a third semiconductor region provided between the first semiconductor region and the second semiconductor region. The third semiconductor region is of a second conductivity type. The first electrode is electrically connected to the first semiconductor region. The second electrode is electrically connected to the second semiconductor region. The gate terminal is electrically connected to the gate electrode. The first conductive member is electrically insulated from the first electrode, the second electrode, and the gate electrode. A first distance between the gate electrode and the third semiconductor region is less than a second distance between the first conductive member and the third semiconductor region. The first terminal is electrically connected to the first conductive member. The first insulating member includes a first insulating region between the third semiconductor region and the gate electrode, and a second insulating region between the gate electrode and the first conductive member. A second signal is inputtable to the first terminal and is switched at a different timing from a first signal input to the gate terminal.

According to one embodiment, a semiconductor device includes an element part, and a control circuit. The element part includes a semiconductor member, a first electrode, a second electrode, a gate electrode, a gate terminal, a first conductive member, a first terminal, and a first insulating member. The semiconductor member includes a first semiconductor region of a first conductivity type, a second semiconductor region of the first conductivity type, and a third semiconductor region provided between the first semiconductor region and the second semiconductor region. The third semiconductor region is of a second conductivity type. The first electrode is electrically connected to the first semiconductor region. The second electrode is electrically connected to the second semiconductor region. The gate terminal is electrically connected to the gate electrode. The first conductive member is electrically insulated from the first electrode, the second electrode, and the gate electrode. A first distance between the gate electrode and the third semiconductor region is less than a second distance between the first conductive member and the third semiconductor region. The first terminal is electrically connected to the first conductive member. The first insulating member includes a first insulating region between the third semiconductor region and the gate electrode, and a second insulating region between the gate electrode and the first conductive member. The control circuit is electrically connected to the second electrode, the first electrode, the gate terminal, and the first terminal. The control circuit supplies a first signal to the gate terminal. The control circuit is configured to supply a second signal to the first terminal. The second signal is switched at a different timing from the first signal.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment on includes a semiconductor member 10, a first electrode 51, a second electrode 52, a gate electrode 53, a gate terminal Tg, a first conductive member 61, a first terminal T1, and a first insulating member 41.

The semiconductor member 10 includes a first semiconductor region 11 of a first conductivity type, a second semiconductor region 12 of the first conductivity type, and a third semiconductor region 13 of a second conductivity type. The third semiconductor region 13 is located between the first semiconductor region 11 and the second semiconductor region 12.

For example, the first conductivity type is an n-type, and the second conductivity type is a p-type. In the embodiments, the first conductivity type may be the p-type, and the second conductivity type may be the n-type. Hereinbelow, the first conductivity type is taken to be the n-type, and the second conductivity type is taken to be the p-type.

The first electrode 51 is electrically connected to the first semiconductor region 11. The second electrode 52 is electrically connected to the second semiconductor region 12. A first electrode terminal Td and a second electrode terminal Ts are provided in the example. The first electrode terminal Td is electrically connected to the first electrode 51. The second electrode terminal Ts is electrically connected to the second electrode 52.

For example, the gate electrode 53 faces the third semiconductor region 13. For example, the gate electrode 53 may face the boundary region between the third semiconductor region 13 and the first semiconductor region 11. For example, the gate electrode 53 may face the boundary region between the third semiconductor region 13 and the second semiconductor region 12. The third semiconductor region 13 includes, for example, a channel.

The gate terminal Tg is electrically connected to the gate electrode 53.

The first conductive member 61 is electrically insulated from the first electrode 51, the second electrode 52, and the gate electrode 53. The first terminal T1 is electrically insulated from the first electrode 51, the second electrode 52, and the gate electrode 53.

The first insulating member 41 includes a first insulating region 41a and a second insulating region 41b. The first insulating region 41a is located between the third semiconductor region 13 and the gate electrode 53. The second insulating region 41b is located between the gate electrode 53 and the first conductive member 61.

A first distance d1 between the gate electrode 53 and the third semiconductor region 13 is less than a second distance d2 between the first conductive member 61 and the third semiconductor region 13. The first distance d1 is, for example, the shortest distance between the gate electrode 53 and the third semiconductor region 13. The second distance d2 is the shortest distance between the first conductive member 61 and the third semiconductor region 13.

The gate terminal Tg and the first terminal T1 are independent of each other in the semiconductor device 110. Mutually-different signals are inputtable to the gate terminal Tg and the first terminal T1. For example, a first signal is input to the gate terminal Tg. A second signal is input to the first terminal T1. The second signal is switched at a different timing from the first signal.

For example, the current that flows between the first electrode terminal Td (the first electrode 51) and the second electrode terminal Ts (the second electrode 52) can be controlled by the first signal input to the gate terminal Tg (the gate electrode 53).

As described below, it was found that the Miller period can be controlled by switching the signal input to the first terminal T1 after the on/off of the gate electrode 53. For example, the Miller period can be reduced. The switching loss can be reduced thereby. According to the embodiment, a semiconductor device can be provided in which the characteristics can be improved.

For example, the gate electrode 53 is an electrode for current control. The first conductive member 61 has a function of controlling the switching characteristics. For example, the magnitude of the current flowing between the first electrode terminal Td and the second electrode terminal Ts changes according to the change of the first signal input to the gate terminal Tg. On the other hand, the current between the first electrode terminal Td and the second electrode terminal Ts does not change according to the change of the second signal input to the first conductive member 61. Or, the change of the current according to the change of the second signal is less than the change of the current according to the change of the first signal. Examples of characteristics of the semiconductor device 110 are described below. The first electrode 51 is a drain electrode. The second electrode 52 is, for example, a source electrode.

An example of the configuration of the semiconductor device 110 will now be described.

As shown in FIG. 1, the direction (a first direction) from the first electrode 51 toward the second electrode 52 is taken as a Z-axis direction. One direction perpendicular to the Z-axis direction is taken as an X-axis direction. A direction perpendicular to the Z-axis direction and the X-axis direction is taken as a Y-axis direction.

For example, the semiconductor member 10 has a layer configuration spreading along the X-Y plane. For example, the first electrode 51 is located at the lower surface of the semiconductor member 10; and the second electrode 52 is located at the upper surface of the semiconductor member 10.

In the example as shown in FIG. 1, the first semiconductor region 11 includes a first partial region 11a, a second partial region 11b, and a third partial region 11c. The direction from the first partial region 11a toward the second partial region 11b is along a second direction. The second direction crosses the first direction (the Z-axis direction). The second direction is, for example, the X-axis direction.

In the example, the third partial region 11c is between the first partial region 11a and the second semiconductor region 12 in the first direction (the Z-axis direction). The third semiconductor region 13 is between the third partial region 11c and the second semiconductor region 12 in the first direction.

In the example, the direction from the third semiconductor region 13 toward the gate electrode 53 is along the second direction (e.g., the X-axis direction). At least a portion of the gate electrode 53 is between the second partial region 11b and the second electrode 52 in the first direction (the Z-axis direction).

A fourth semiconductor region 14 of the second conductivity type (e.g., the p-type) is provided in the example. The fourth semiconductor region 14 is located between the third semiconductor region 13 and the second electrode 52. A fifth semiconductor region 15 of the first conductivity type (e.g., the n-type) is provided in the example. The fifth semiconductor region 15 is located between the first semiconductor region 11 and the first electrode 51.

For example, the first-conductivity-type impurity concentration in the second semiconductor region 12 is greater than the first-conductivity-type impurity concentration in the first semiconductor region 11. For example, the first-conductivity-type impurity concentration in the fifth semiconductor region 15 is greater than the first-conductivity-type impurity concentration in the first semiconductor region 11. The second-conductivity-type impurity concentration in the fourth semiconductor region 14 is greater than the second-conductivity-type impurity concentration in the third semiconductor region 13.

For example, the first semiconductor region 11 is an $n^-$-region. For example, the second semiconductor region 12 is an $n^+$-region. For example, the third semiconductor region 13 is a $p^-$-region. For example, the fourth semiconductor region 14 is a $p^+$-region. For example, the fifth semiconductor region 15 is an $n^+$-region.

The semiconductor member 10 includes, for example, silicon. The semiconductor member 10 may include, for example, a compound semiconductor, etc.

In the example, the position in the second direction (the X-axis direction) of the gate electrode 53 is between the position in the second direction of the third partial region 11c and the position in the second direction of the first conductive member 61.

In the example, the semiconductor device 110 includes a second conductive member 62. The direction from a portion of the third partial region 11c toward the second conductive member 62 is along the second direction (e.g., the X-axis direction). In the example, the position in the first direction (the Z-axis direction) of the second conductive member 62 is between the position in the first direction of the second partial region 11b and the position in the first direction of the gate electrode 53.

The first insulating member 41 includes a third insulating region 41c and a fourth insulating region 41d. The third insulating region 41c is between the third partial region 11c and the second conductive member 62 in the second direction (e.g., the X-axis direction). The fourth insulating region 41d is between the second partial region 11b and the second conductive member 62 in the first direction (the Z-axis direction).

The second conductive member 62 is electrically connected to the second electrode 52. Or, the second conductive member 62 is electrically connectable to the second electrode 52. In one example as shown in FIG. 1, the second conductive member 62 is electrically connected to the second electrode 52 by an interconnect 62L. For example, the interconnect 62L may be included in the semiconductor device 110.

As shown in FIG. 1, a second terminal T2 may be electrically connected to the second conductive member 62. The second terminal T2 and the second electrode terminal Ts may be electrically connected by an interconnect (which may be, for example, the interconnect 62L) not included in the semiconductor device 110, etc. Thereby, the second conductive member 62 is electrically connected to the second electrode 52.

For example, the concentration of the electric field is suppressed by providing the second conductive member 62. For example, the second conductive member 62 can function as a field plate.

Multiple structures that include the gate electrode 53 and the first conductive member 61 may be provided in the semiconductor device according to the embodiment. The multiple structures are arranged in the X-axis direction.

As described above, the Miller period can be controlled by switching the signal input to the first terminal T1 after the on/off of the gate electrode 53. It is considered that this phenomenon is caused by the electrical capacitance based on the first conductive member 61 promoting the charging and discharging of the electrical capacitance based on the gate electrode 53.

An example of an electrical circuit relating to the semiconductor device 110 will now be described.

Figure 2A:
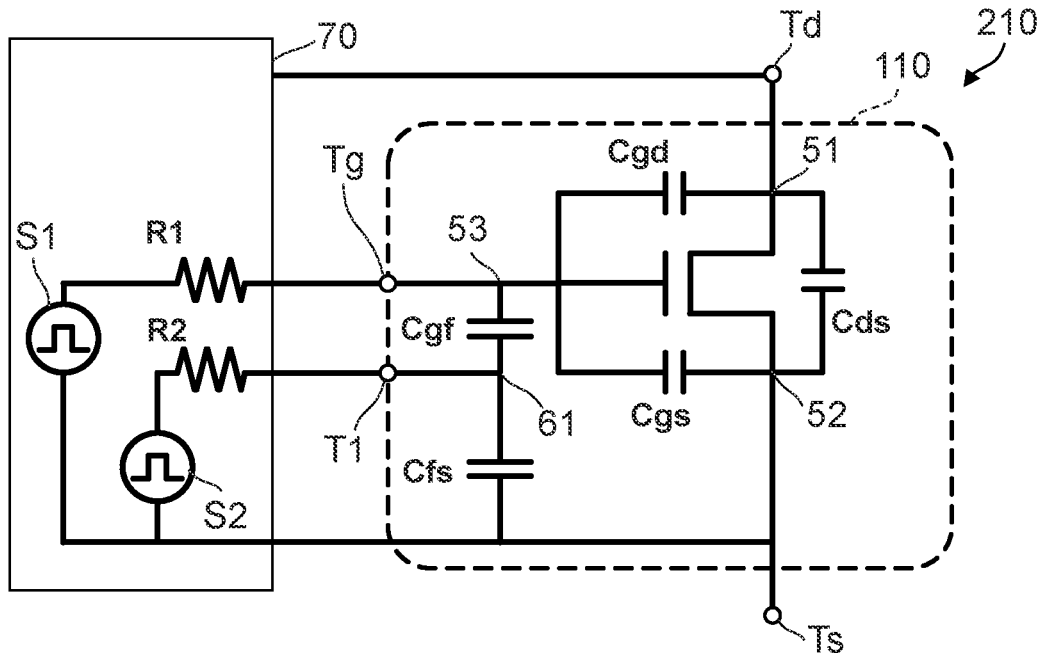
FIGS. 2A and 2B are circuit diagrams illustrating the semiconductor device according to the first embodiment.
Figure 2B:
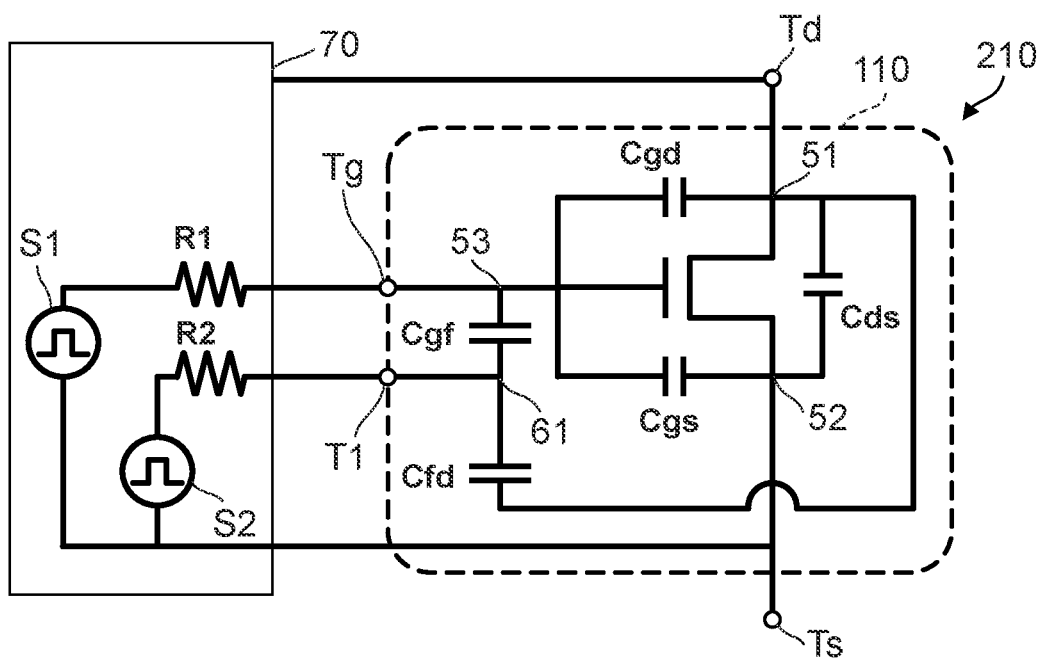

FIGS. 2A and 2B are circuit diagrams illustrating the semiconductor device according to the first embodiment.

A control circuit 70 is provided as shown in FIG. 2A. The control circuit 70 may be provided separately from the semiconductor device 110. The semiconductor device 110 and the control circuit 70 may be included in a semiconductor device 210 according to the embodiment.

For example, the control circuit 70 is electrically connected to the gate terminal Tg and the first terminal T1. The control circuit 70 may be electrically connected to the first electrode terminal Td and the second electrode terminal Ts. The control circuit 70 may include a resistance R1 connected to the gate terminal Tg. The control circuit 70 may include a resistance R2 connected to the first terminal T1. A first signal S1 is supplied from the control circuit 70 to the gate terminal Tg. A second signal S2 is supplied from the control circuit 70 to the first terminal T1.

For example, a capacitance Cds is formed between the first electrode 51 and the second electrode 52. A capacitance Cgs is formed between the gate electrode 53 and the second electrode 52. A capacitance Cgd (a first electrical capacitance) is formed between the gate electrode 53 and the first electrode 51. A capacitance Cgf (a second electrical capacitance) is formed between the gate electrode 53 and the first conductive member 61. A capacitance Cfs is formed between the first conductive member 61 and the second electrode 52. The charging and discharging of these capacitances are performed by the first and second signals S1 and S2.

In the embodiment, the charging and discharging of the capacitance Cgd is promoted by the capacitance Cgf by switching the second signal S2 after the switching of the first signal S1. For example, when the capacitance Cgd is charged by the first signal S1, the charge that is stored in the capacitance Cgf can flow into the capacitance Cgd; and the charge of the capacitance Cgd is effectively performed.

For example, the first electrical capacitance (the capacitance Cgd) between the gate electrode 53 and the first electrode 51 is less than the second electrical capacitance (the capacitance Cgf) between the gate electrode 53 and the first conductive member 61. Thereby, the charging and discharging of the capacitance Cgd is more effectively promoted by the capacitance Cgf.

As shown in FIG. 1, for example, at least a portion of the first conductive member 61 is between the first electrode 51 and the second electrode 52. When another capacitance element is connected by an interconnect or the like between the gate electrode 53 and the first conductive member 61, the electrical capacitance between the gate electrode 53 and the first conductive member 61 is unstable due to a stray capacitance of the interconnect or the like. Conversely, because at least a portion of the first conductive member 61 is between the first electrode 51 and the second electrode 52, the capacitance Cgf between the gate electrode 53 and the first conductive member 61 is stable. The charging and discharging of the capacitance Cgd such as that described above can be stably performed thereby.

As shown in FIG. 2B, a capacitance Cfd may be formed between the first conductive member 61 and the first electrode. In such a case as well, the capacitance Cgd (the first electrical capacitance) is formed between the gate electrode 53 and the first electrode 51; and the capacitance Cgf (the second electrical capacitance) is formed between the gate electrode 53 and the first conductive member 61. In such a case as well, the charging and discharging of the capacitance Cgd is promoted by the capacitance Cgf.

FIGS. 3A to 3C are schematic views illustrating an operation of the semiconductor device according to the first embodiment.

In these figures, the horizontal axis is time tm. The vertical axis of FIG. 3A is the voltage of the first signal S1 input to the gate terminal Tg. The vertical axis of FIG. 3B is the voltage of the second signal S2 input to the first terminal T1 electrically connected to the first conductive member 61. The vertical axis of FIG. 3C is the voltage (a gate voltage Vg) of the gate electrode 53.

As shown in FIG. 3A, the first signal S1 is switched from off (a voltage Vf1) to on (a voltage Vn1) at a first on-time tn1. The first signal S1 is switched from on (the voltage Vn1) to off (the voltage Vf1) at a first off-time tf1.

As shown in FIG. 3B, the second signal S2 is switched from off (a voltage Vf2) to on (a voltage Vn2) at a second on-time tn2. The second signal S2 is switched from on (the voltage Vn2) to off (the voltage Vf2) at a second off-time tf2. For example, at least one of the second on-time tn2 or the second off-time tf2 is not the same as at least one of the first on-time tn1 or the first off-time tf1. A second voltage V2 of the second signal S2 is the difference between the voltage Vn2 and the voltage Vf2.

FIG. 3C illustrates the gate voltage Vg when the second signal S2 is not input to the first terminal T1 (the first conductive member 61), and the potential of the first terminal T1 is equal to the potential of the second electrode 52 (e.g., the source potential). FIG. 3C corresponds to the gate voltage Vg of a reference example in which the first conductive member 61 is not provided.

As shown in FIG. 3C, the gate voltage Vg includes an off-voltage Vgf and an on-voltage Vgn. In an off-period Pf, the gate voltage Vg is the off-voltage Vgf. In an on-period Pn, the gate voltage Vg is the on-voltage Vgn. The voltage of the second signal S2 (the second voltage V2 illustrated in FIG. 3B) may be equal to or different from the difference between the on-voltage Vgn and the off-voltage Vgf (a first voltage V1 illustrated in FIG. 3C). As described below, the switching loss is efficiently and easily suppressed when the second voltage V2 is greater than the first voltage V1.

An on-Miller period Pmn exists in the transition period from the off-period Pf to the on-period Pn. The change rate of the gate voltage Vg with respect to the time tm in the on-Miller period Pmn is less than the change rate of the gate voltage Vg with respect to the time tm in the other portions in the transition period. For example, the gate voltage Vg is substantially constant in the on-Miller period Pmn.

An off-Miller period Pmf exists in the transition period from the on-period Pn to the off-period Pf. The change rate of the gate voltage Vg with respect to the time tm in the off-Miller period Pmf is less than the change rate of the gate voltage Vg with respect to the time tm in the other portions in the transition period. For example, the gate voltage Vg is substantially constant in the off-Miller period Pmf.

For example, when the potential of the first terminal T1 is equal to the potential of the second electrode 52 (e.g., the source potential), the on-Miller period Pmn starts at an on-Miller start time tns and ends at an on-Miller end time tne. The on-Miller start time tns is after the on-time (e.g., the first on-time tn1) at which the first signal S1 is switched from off to on. The on-Miller end time tne is after the on-Miller start time tns.

For example, when the potential of the first terminal T1 is equal to the potential of the second electrode 52 (e.g., the source potential), the off-Miller period Pmf starts at an off-Miller start time tfs and ends at an off-Miller end time tfe. The off-Miller start time tfs is after the off-time (e.g., the first off-time tf1) at which the first signal S1 is switched from on to off. The off-Miller end time tfe is after the off-Miller start time tfs.

In the embodiment as shown in FIGS. 3A and 3B, it is favorable for the second signal S2 to be switched from off to on at the second on-time tn2 that is after the first on-time tn1 at which the first signal S1 is switched from off to on. It is favorable for the second on-time tn2 to be before the on-Miller end time tne. For example, the period (an on-time difference Tdn) from the first on-time tn1 to the second on-time tn2 is shorter than a period Tmen from the on-time (the first on-time tn1) to the on-Miller end time tne. For example, the period (the on-time difference Tdn) from the first on-time tn1 to the second on-time tn2 may be not more than a period Tmsn from the on-time (e.g., the first on-time tn1) to the on-Miller start time tns.

In the embodiment as shown in FIGS. 3A and 3B, it is favorable for the second signal S2 to be switched from on to off at the second off-time tf2 that is after the first off-time tf1 at which the first signal S1 is switched from on to off. It is favorable for the second off-time tf2 to be before the off-Miller end time tfe. For example, the period (an off-time difference Tdf) from the first off-time tf1 to the second off-time tf2 is shorter than a period Tmef from the off-time (the first off-time tf1) to the off-Miller end time tfe. For example, the period (the off-time difference Tdf) from the first off-time tf1 to the second off-time tf2 may be not more than a period Tmsf from the off-time (e.g., the first off-time tf1) to the off-Miller start time tfs.

For example, the Miller period can be reduced by such a second signal S2. For example, the gate voltage Vg can be steeply changed. The switching loss can be suppressed thereby.

An example of simulation results of characteristics of the semiconductor device will now be described.

FIGS. 4A to 4D, 5A to 5D, and 6A to 6D are schematic views illustrating characteristics of the semiconductor device.

Figure 4A:
FIGS. 4A to 4D are schematic views illustrating characteristics of the semiconductor device.
Figure 4B:
Figure 4C:
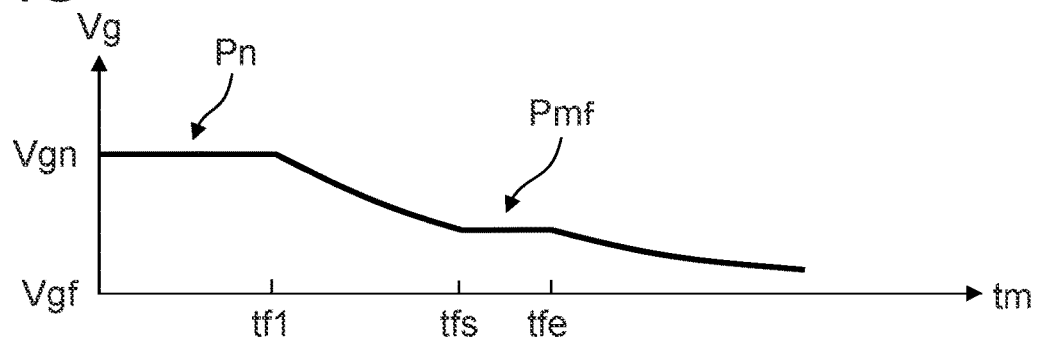
Figure 4D:
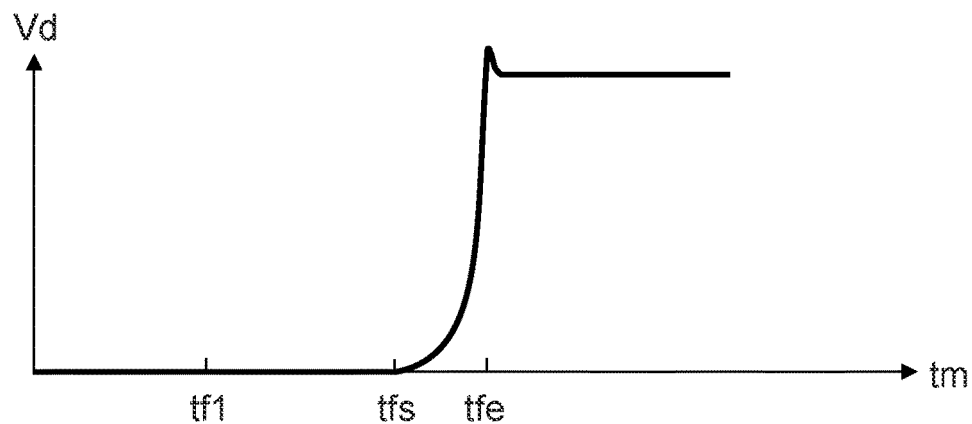
Figure 5A:
FIGS. 5A to 5D are schematic views illustrating characteristics of the semiconductor device.
Figure 5B:
Figure 5C:
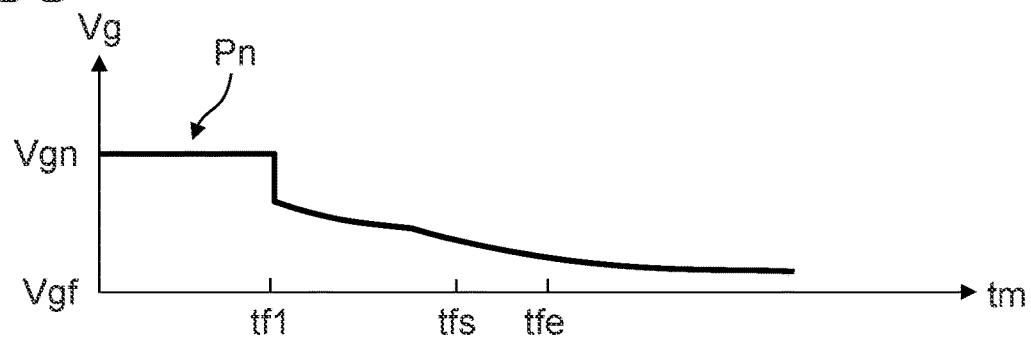
Figure 5D:
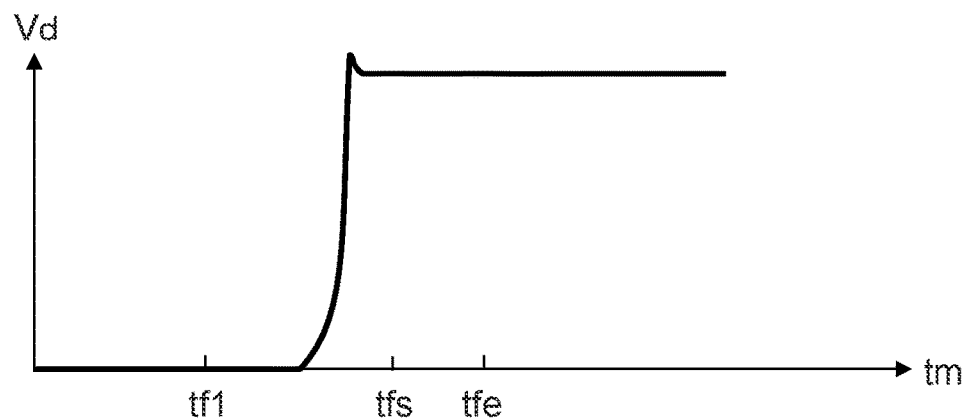
Figure 6A:
FIGS. 6A to 6D are schematic views illustrating characteristics of the semiconductor device.
Figure 6B:
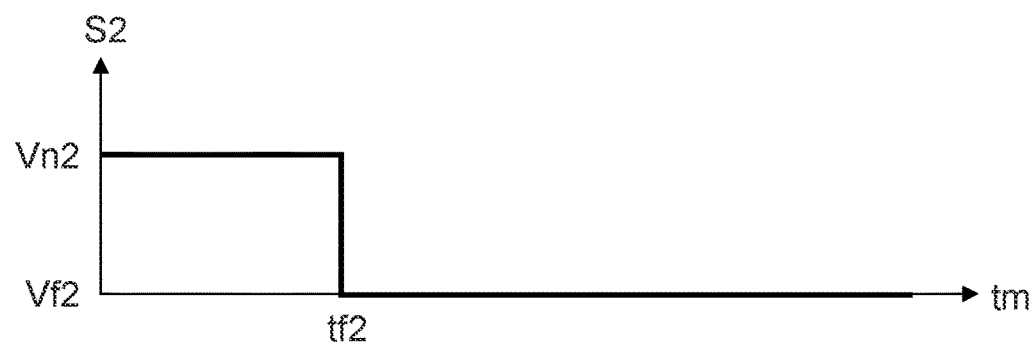
Figure 6C:
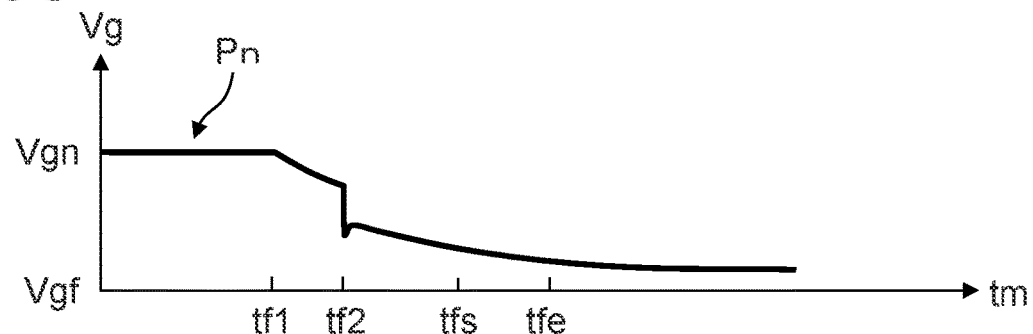
Figure 6D:
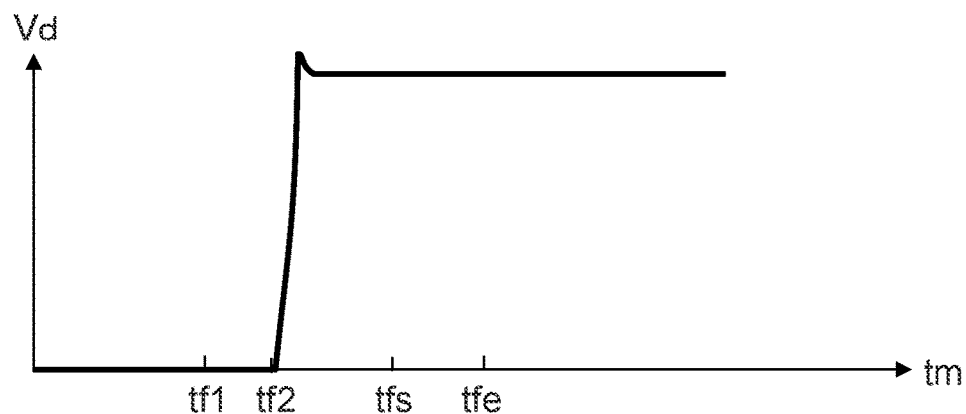

These figures illustrate switching characteristics when switching from on to off. In these figures, the horizontal axis is the time tm. In FIGS. 4A, 5A, and 6A, the vertical axis is the first signal S1. In FIGS. 4B, 5B, and 6B, the vertical axis is the second signal S2. In FIGS. 4C, 5C, and 6C, the vertical axis is the gate voltage Vg. In FIGS. 4D, 5D, and 6D, the vertical axis is a drain voltage Vd.

FIGS. 4A to 4D correspond to when the potential of the first terminal T1 (the first conductive member 61) is equal to the potential of the second electrode 52 (e.g., the source potential). As shown in FIG. 4B, the second signal S2 is not input. As shown in FIG. 4C, the off-Miller period Pmf occurs from the off-Miller start time tfs, which is after the first off-time tf1 of the first signal S1, to the off-Miller end time tfe. As shown in FIG. 4D, the drain voltage Vd gradually changes. A switching loss occurs due to the off-Miller period Pmf and the gradually-changing drain voltage Vd.

FIGS. 5A to 5D correspond to when the second signal S2 is input to the first terminal T1 (the first conductive member 61). In the example as shown in FIGS. 5A and 5B, the second off-time tf2 of the second signal S2 is the same as the first off-time tf1 of the first signal S1. As shown in FIG. 5C, the off-Miller period Pmf is substantially not observed. As shown in FIG. 5D, the drain voltage Vd steeply changes. The switching loss can be suppressed by using such a second signal S2.

FIGS. 6A to 6D also correspond to when the second signal S2 is input to the first terminal T1 (the first conductive member 61). In the example as shown in FIGS. 6A and 6B, the second off-time tf2 of the second signal S2 is after the first off-time tf1 of the first signal S1. In the example, the second off-time tf2 of the second signal S2 is before the off-Miller start time tfs. As shown in FIG. 6C, the off-Miller period Pmf is substantially not observed. As shown in FIG. 6D, compared to FIG. 5D, the drain voltage Vd changes more steeply. The switching loss can be further suppressed by using such a second signal S2.

It is considered that such characteristics are due to the charging and discharging of the gate-drain capacitance (the capacitance Cgd) being assisted by the capacitance Cgf based on the first conductive member 61.

For example, because the first electrical capacitance (the capacitance Cgd) between the gate electrode 53 and the first electrode 51 is less than the second electrical capacitance (the capacitance Cgf) between the gate electrode 53 and the first conductive member 61, the assist of the charging and discharging is more effectively performed. The capacitance Cgf may be, for example, not less than 0.5 times and not more than 3 times the capacitance Cgd.

For example, a charge amount Qgd (a first charge amount) is charged to or discharged from the gate terminal Tg (the capacitance Cgd between the gate terminal Tg and the first electrode terminal Td) by the first signal S1. A charge amount Qgf (a second charge amount) is charged to or discharged from the first terminal T1 (the capacitance Cgf between the first terminal T1 and the gate terminal Tg) by the second signal S2. In the embodiment, it is favorable for the charge amount Qgd (the first charge amount) to be less than the charge amount Qgf (the second charge amount). The assist of the charging and discharging described above is more effectively performed thereby. For example, the charge amount Qgf may be not less than 0.5 times and not more than 3 times the charge amount Qgd.

For example, the charge amount Qgd is determined by the capacitance Cgd and the voltage of the first signal S1. For example, the charge amount Qgf is determined by the capacitance Cgf and the voltage of the second signal S2.

An example of simulation results relating to the change of characteristics when the timing of the second signal S2 is modified will now be described.

Figure 7A:
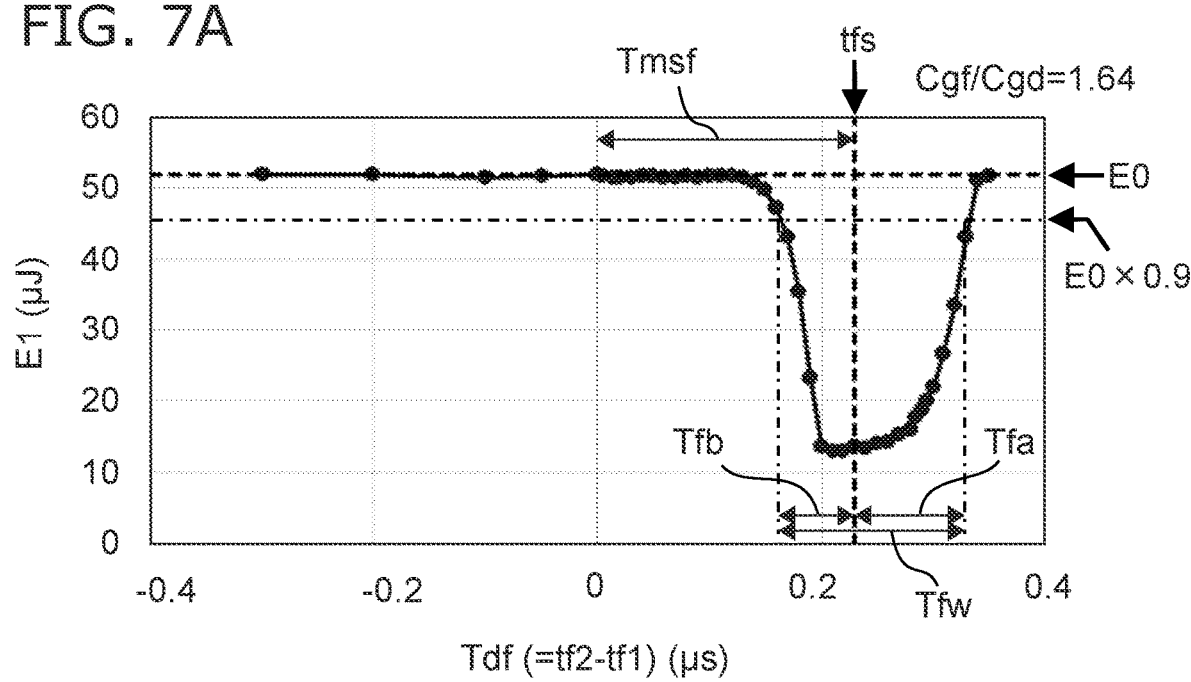
FIGS. 7A and 7B are graphs illustrating characteristics of the semiconductor device according to the first embodiment.
Figure 7B:
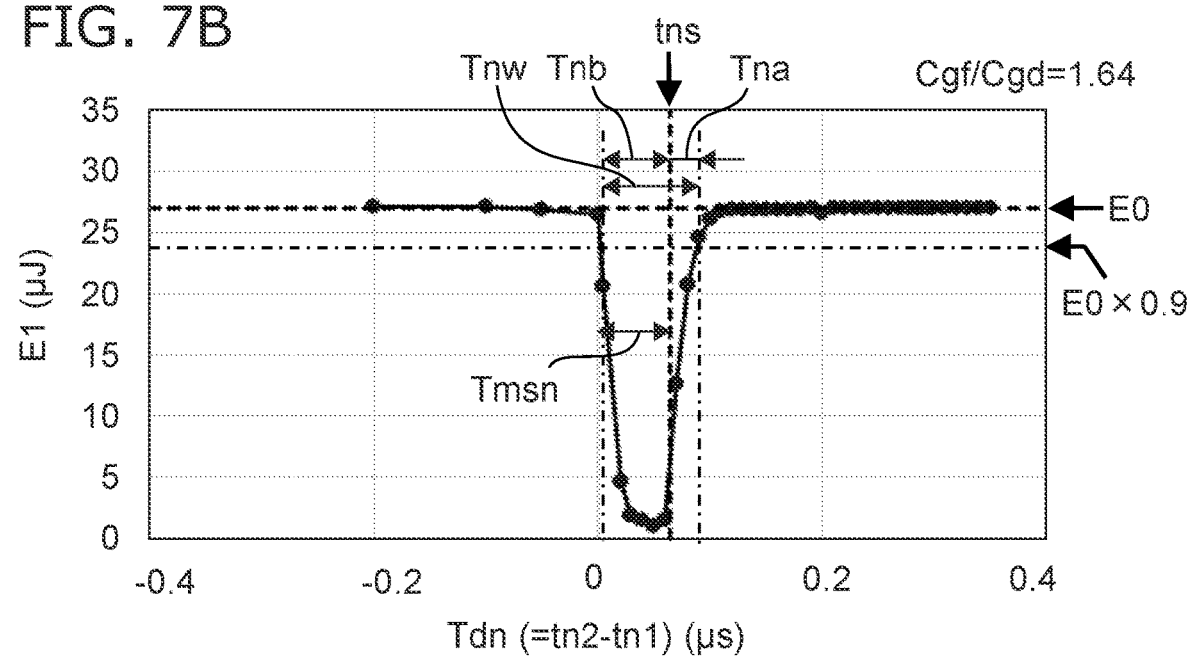

FIGS. 7A and 7B are graphs illustrating characteristics of the semiconductor device according to the first embodiment.

FIG. 7A corresponds to a characteristic in the off-state; and FIG. 7B corresponds to a characteristic in the on-state. The horizontal axis of FIG. 7A is the off-time difference Tdf. The off-time difference Tdf is the difference between the second off-time tf2 (the off-time of the second signal S2) and the first off-time tf1 (the off-time of the first signal S1). When the off-time difference Tdf is negative, the second signal S2 is switched off before the first signal S1. When the off-time difference Tdf is positive, the second signal S2 is switched off after the first signal S1. The vertical axis of FIG. 7A is a switching loss E1 in the off-state. The horizontal axis of FIG. 7B is the on-time difference Tdn. The on-time difference Tdn is the difference between the second on-time tn2 (the on-time of the second signal S2) and the first on-time tn1 (the on-time of the first signal 51). When the on-time difference Tdn is negative, the second signal S2 is switched on before the first signal S1. When the on-time difference Tdn is positive, the second signal S2 is switched on after the first signal 51. The vertical axis of FIG. 7B is the switching loss E1 in the on-state. These figures also illustrate the switching loss (a reference value E0) when the second signal S2 is not applied.

In the example of FIGS. 7A and 7B, the capacitance Cgf (the second electrical capacitance) divided by the capacitance Cgd (the first electrical capacitance) is 1.64.

As shown in FIG. 7A, when the off-time difference Tdf is negative, the switching loss E1 in the off-state is equal to the reference value E0. When the off-time difference Tdf is positive, the switching loss E1 in the off-state is reduced.

In the example shown in FIG. 7A, the switching loss E1 is effectively reduced when the off-time difference Tdf is not less than about 0.15 μs and not more than about 0.32 μs. In the example, the period Tmsf (the period from the first off-time tf1 to the off-Miller start time tfs) is about 0.23 μs. For example, the switching loss E1 is effectively reduced when the off-time difference Tdf is in the range not less than about 0.7 times and not more than about 1.4 times the period Tmsf.

As shown in FIG. 7B, when the on-time difference Tdn is negative, the switching loss E1 in the on-state is equal to the reference value E0. When the on-time difference Tdn is positive, the switching loss E1 in the on-state is reduced.

In the example shown in FIG. 7B, the switching loss E1 is effectively reduced when the on-time difference Tdn is not less than about 0.005 μs and not more than about 0.09 μs. In the example, the period Tmsn (the period from the first on-time tn1 to the on-Miller start time tns) is about 0.07 μs. For example, the switching loss E1 is effectively reduced when the on-time difference Tdn is in the range not less than about 0.1 times and not more than about 1.3 times the period Tmsf.

FIGS. 8A, 8B, 9A, 9B, 10A, and 10B are graphs illustrating characteristics of the semiconductor device according to the first embodiment.

Figure 8A:
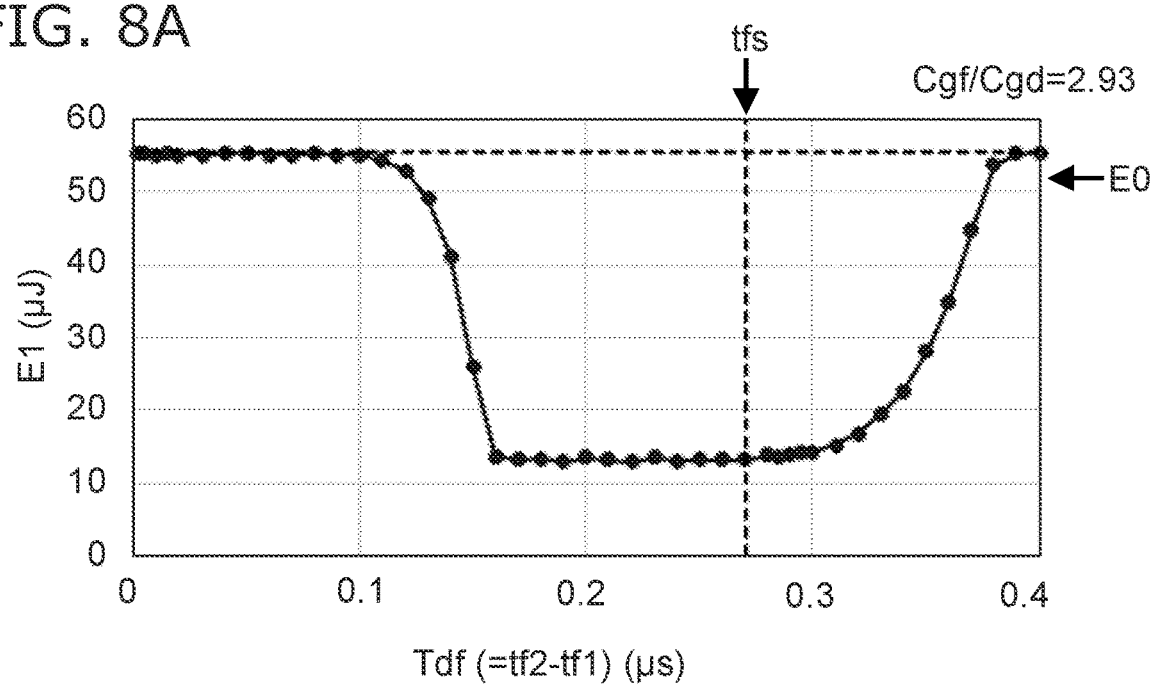
FIGS. 8A and 8B are graphs illustrating characteristics of the semiconductor device according to the first embodiment.
Figure 8B:
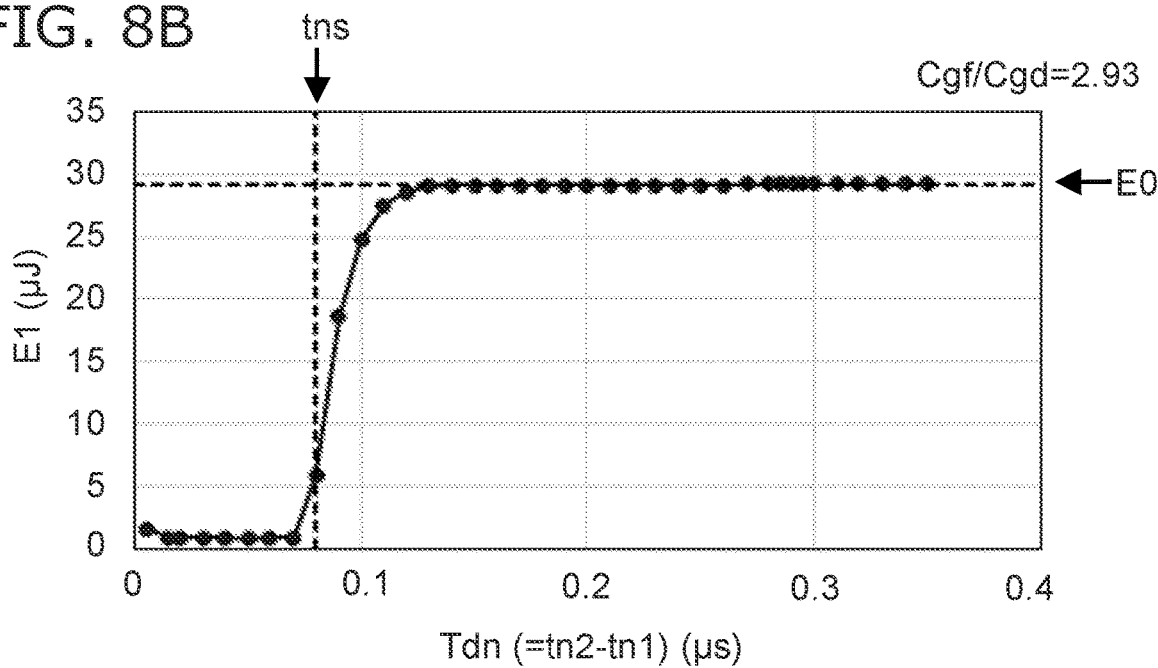
Figure 9A:
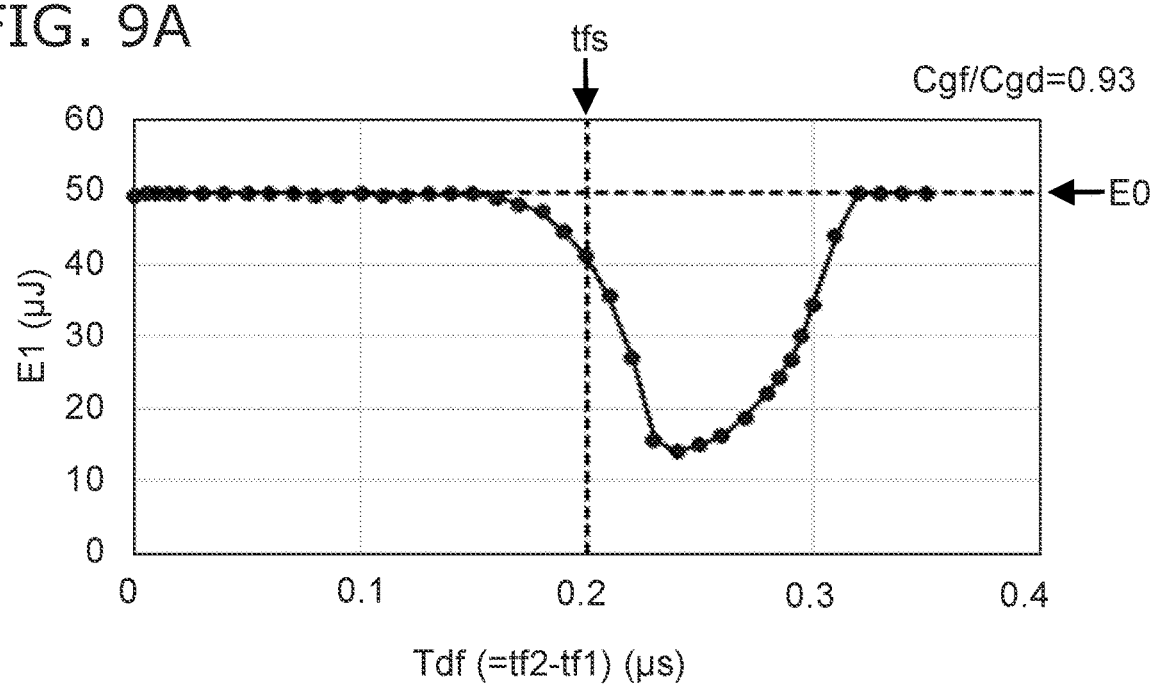
FIGS. 9A and 9B are graphs illustrating characteristics of the semiconductor device according to the first embodiment.
Figure 9B:
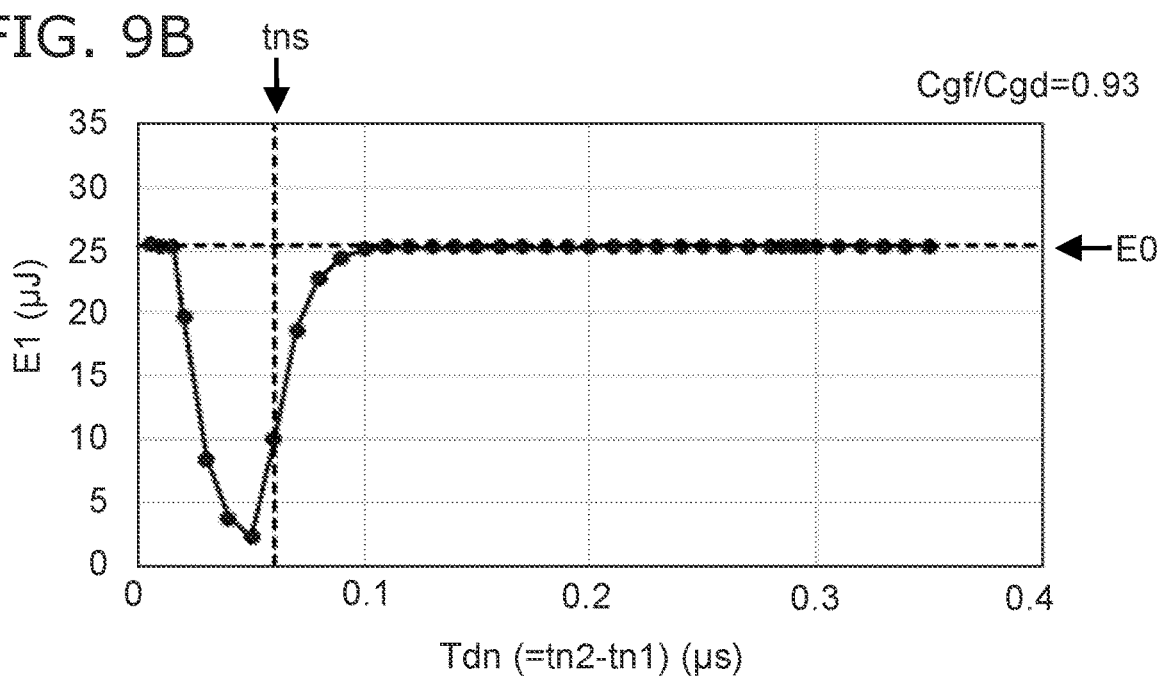
Figure 10A:
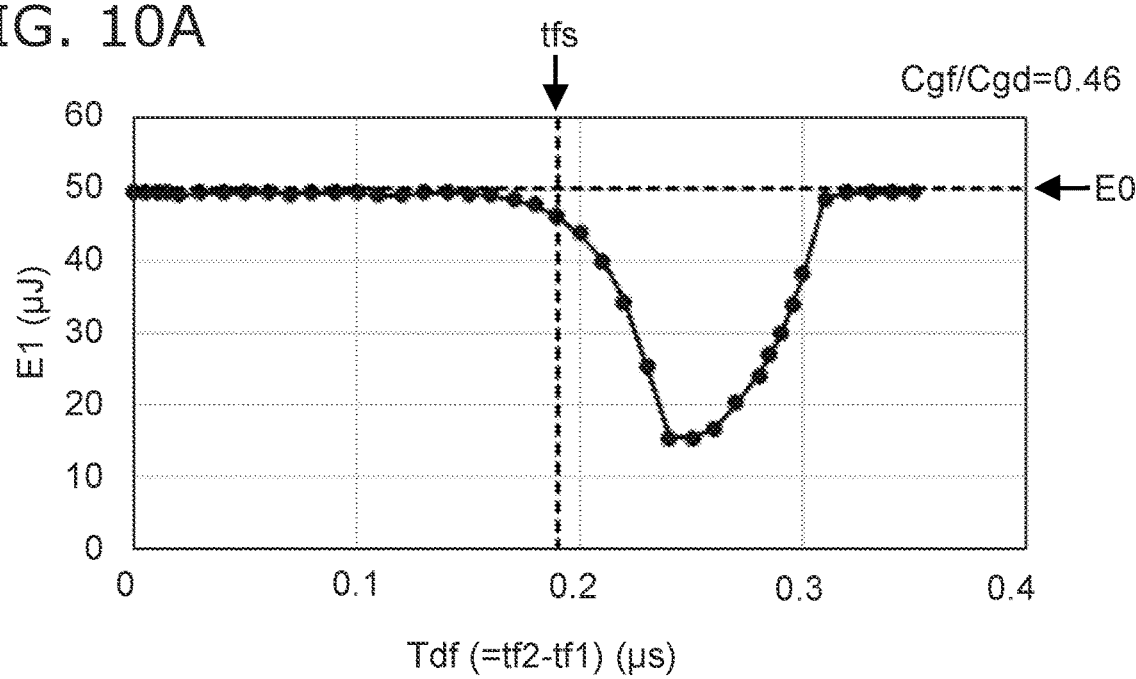
FIGS. 10A and 10B are graphs illustrating characteristics of the semiconductor device according to the first embodiment.
Figure 10B:
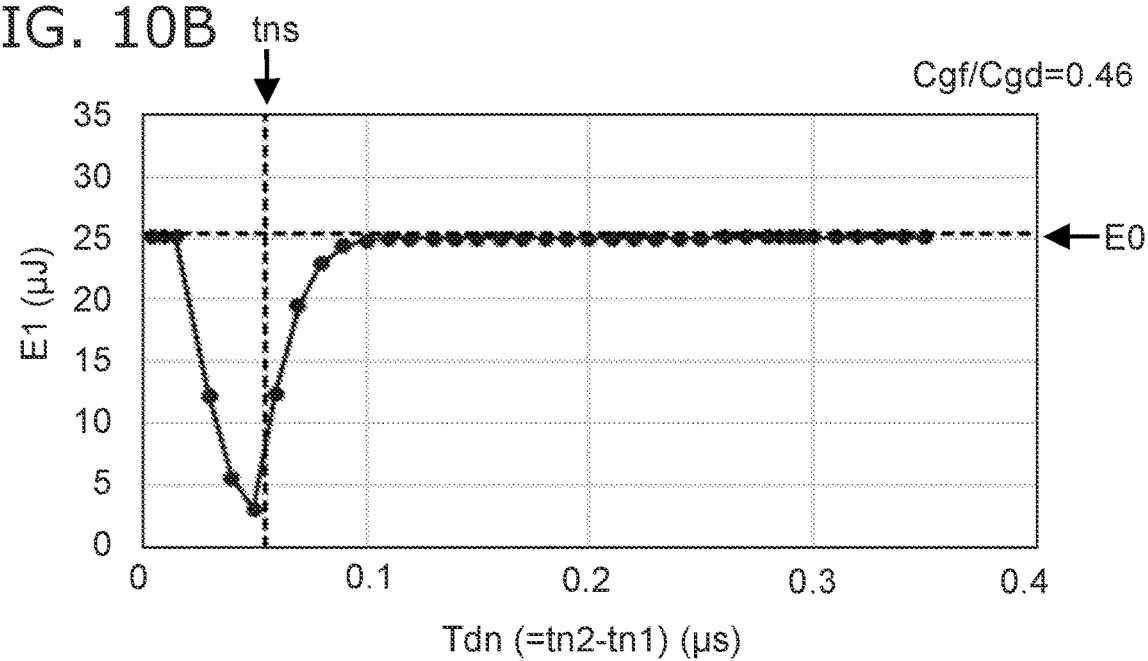

In the example of FIGS. 8A and 8B, Cgf/Cgd is 2.93. In the example of FIGS. 9A and 9B, Cgf/Cgd is 0.93. In the example of FIGS. 10A and 10B, Cgf/Cgd is 0.46. In FIGS. 8A, 9A, and 10A, the horizontal axis is the off-time difference Tdf, and the vertical axis is the switching loss E1 in the off-state. In FIGS. 8B, 9B, and 10B, the horizontal axis is the on-time difference Tdn, and the vertical axis is the switching loss E1 in the on-state. These figures illustrate characteristics when the off-time difference Tdf and the on-time difference Tdn are in positive ranges.

As shown in FIGS. 8A, 9A, and 10A, when the off-time difference Tdf is positive, the switching loss E1 is less than the reference value E0. As shown in FIGS. 8A, 9A, and 10A, the time range in which the switching loss E1 is less than the reference value E0 is wide when Cgf/Cgd is high.

As shown in FIGS. 8B, 9B, and 10B, when the on-time difference Tdn is positive, the switching loss E1 is less than the reference value E0. As shown in FIGS. 8B, 9B, and 10B, the time range in which the switching loss E1 is less than the reference value E0 is wide when Cgf/Cgd is high.

Here, in the off-state as shown in FIG. 7A, the time range in which the switching loss E1 is not more than 0.9 times the reference value E0 is taken as a period width Tfw. The period width Tfw is the sum of a period width Tfa and a period width Tfb. The period width Tfa is the difference between the period Tmsf and the period after the off-Miller start time tfs until the switching loss E1 becomes 0.9 times the reference value E0. The period width Tfb is the difference between the period Tmsf and the period before the off-Miller start time tfs until the switching loss E1 becomes 0.9 times the reference value EQ.

In the on-state as shown in FIG. 7B, the time range in which the switching loss E1 is not more than 0.9 times the reference value E0 is taken as a period width Tnw. The period width Tnw is the sum of a period width Tna and a period width Tnb. The period width Tna is the difference between the period Tmsn and the period after the on-Miller start time tns until the switching loss E1 becomes 0.9 times the reference value EQ. The period width Tnb is the difference between the period Tmsn and the period before the on-Miller start time tns until the switching loss E1 becomes 0.9 times the reference value E0.

Figure 11A:
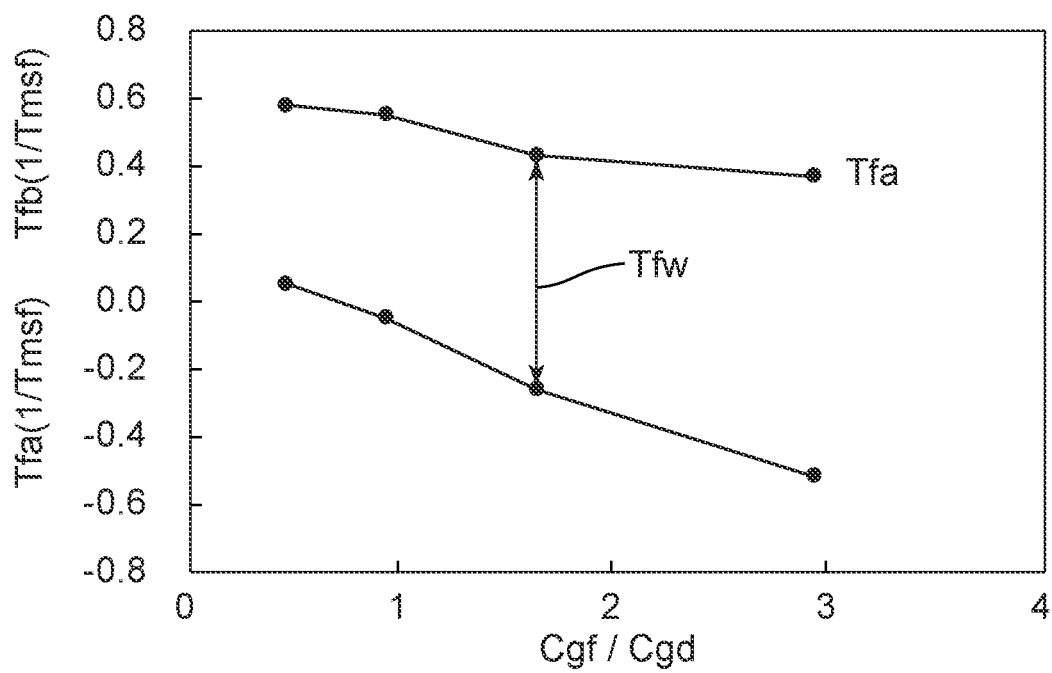
FIGS. 11A and 11B are graphs illustrating characteristics of the semiconductor device according to the first embodiment.
Figure 11B:
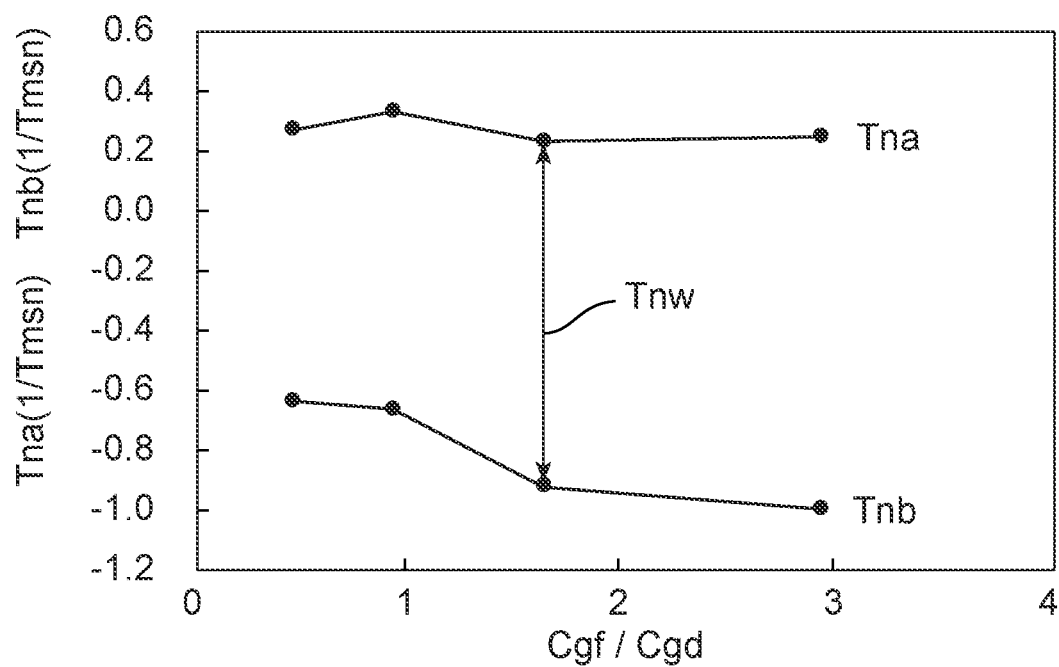

FIGS. 11A and 11B are graphs illustrating characteristics of the semiconductor device according to the first embodiment.

FIG. 11A illustrates the relationship between the period width Tfa, the period width Tfb, and Cgf/Cgd in the off-state. The vertical axis of FIG. 11A illustrates the ratios of the period widths Tfa and Tfb to the period Tmsf. The horizontal axis of FIG. 11A is Cgf/Cgd.

FIG. 11B illustrates the relationship between the period width Tna, the period width Tnb, and Cgf/Cgd in the on-state. The vertical axis of FIG. 11B illustrates the ratios of the period widths Tna and Tnb to the period Tmsn. The horizontal axis of FIG. 11B is Cgf/Cgd.

As shown in FIG. 11A, as Cgf/Cgd increases, the period width Tfa decreases, and the absolute value of the period width Tfb (negative) increases. As Cgf/Cgd increases, the period width Tfw (the time range in which the switching loss E1 is not more than 0.9 times the reference value E0) increases. The absolute value of the period width Tfb (negative) is particularly large when Cgf/Cgd is not less than 1.

As shown in FIG. 11B, the absolute value of the period width Tnb (negative) increases as Cgf/Cgd increases. Even when Cgf/Cgd changes, the period width Tna substantially does not change. The period width Tfw (the time range in which the switching loss E1 is not more than 0.9 times the reference value E0) increases as Cgf/Cgd increases. The absolute value of the period width Tnb (negative) is particularly large when Cgf/Cgd is not less than 1.

In the embodiment, it is favorable for Cgf/Cgd to be high. It is favorable for Cgf/Cgd to be, for example, not less than 1. It is favorable for Cgf/Cgd to be, for example, greater than 1. Cgf/Cgd may be, for example, not less than 1.1.

As illustrated in FIG. 11A, when the period width Tfa in the off-state is not more than about 0.6, the switching loss E1 in the off-state is not more than 0.9 times the reference value E0; and the switching loss E1 can be substantially suppressed. In the embodiment, it is favorable for the period width Tfa in the off-state to be not more than about 0.6. In other words, the off-time difference Tdf (the period from the first off-time tf1 to the second off-time tf2) may be not more than about 1.6 times the period Tmsf from the off-time (e.g., the first off-time tf1) to the off-Miller start time tfs. The off-time difference Tdf may be not more than about 1.5 times the period Tmsf. The off-time difference Tdf may be not more than about 1.4 times the period Tmsf.

In the examples of FIGS. 7A, 8A, 9A, and 10A, the period Tmef (the period from the off-time (the first off-time tf1) to the off-Miller end time tfe) is not less than about 0.6 μs and not more than about 0.9 μs. Accordingly, the off-time difference Tdf is shorter than the period Tmef.

As illustrated in FIG. 11B, when the period width Tna in the on-state is not more than about 0.4, the switching loss E1 in the on-state is not more than 0.9 times the reference value E0; and the switching loss E1 can be substantially suppressed. In the embodiment, it is favorable for the period width Tna in the on-state to be not more than about 0.4. In other words, the on-time difference Tdn (the period from the first on-time tn1 to the second on-time tn2) may be not more than about 1.4 times the period Tmsn from the on-time (e.g., the first on-time tn1) to the on-Miller start time tns. The on-time difference Tdn may be not more than about 1.3 times the period Tmsn.

In the example of FIGS. 7B, 8B, 9B, and 10B, the period Tmen (the period from the on-time (the first on-time tn1) to the on-Miller end time tne) is not less than about 0.1 μs and not more than about 0.5 μs. Accordingly, the on-time difference Tdn is shorter than the period Tmen.

In the characteristics illustrated in FIGS. 7A to 11B, the second voltage V2 (referring to FIG. 3B) is equal to the first voltage V1 (referring to FIG. 3C). An example of characteristics when the second voltage V2 is different from the first voltage V1 will now be described.

Figure 12A:
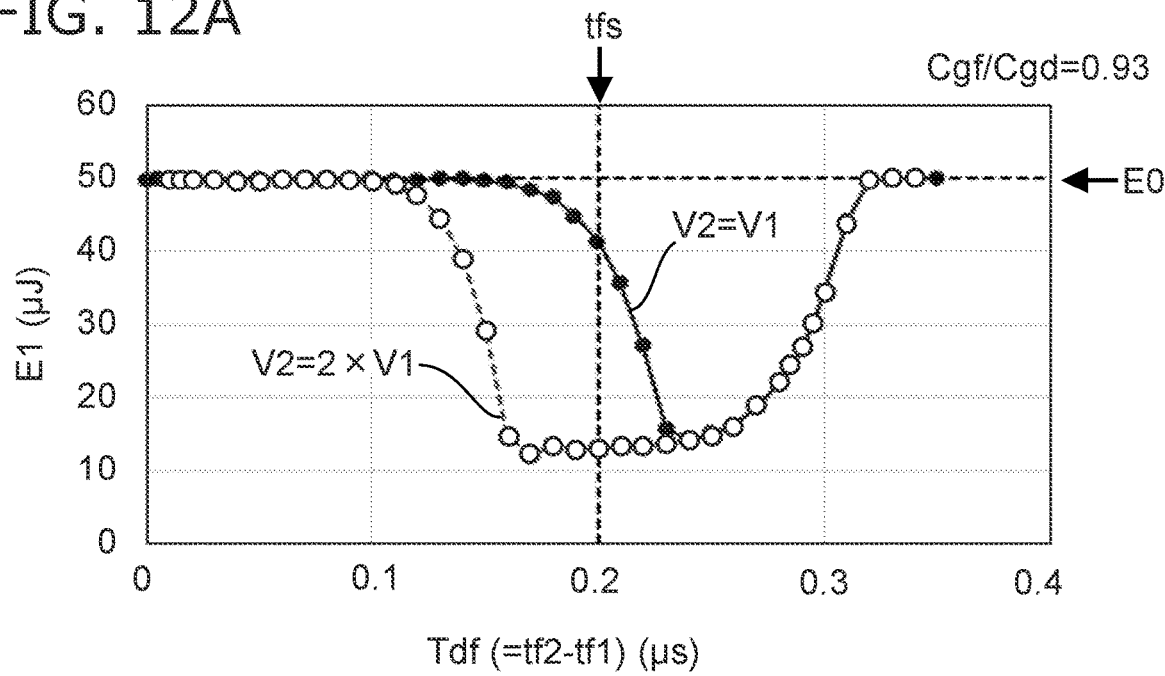
FIGS. 12A and 12B are graphs illustrating characteristics of the semiconductor device according to the first embodiment.
Figure 12B:
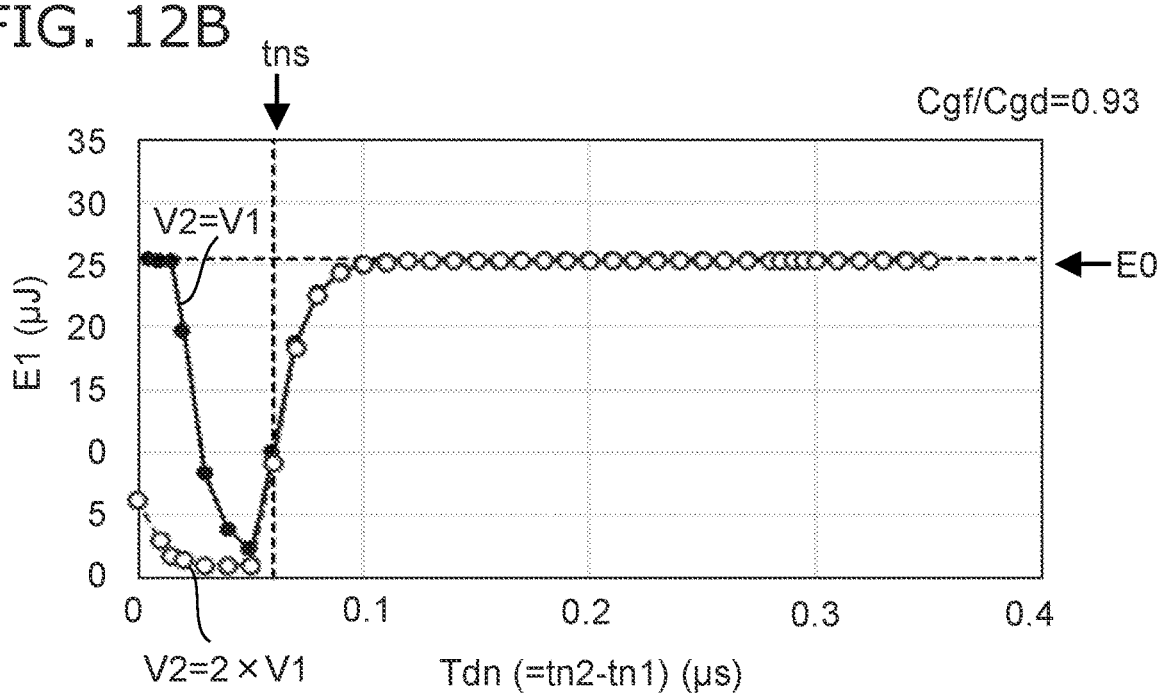

FIGS. 12A and 12B are graphs illustrating characteristics of the semiconductor device according to the first embodiment.

In FIGS. 12A and 12B, Cgf/Cgd is 0.93. In FIG. 12A, the characteristic when the second voltage V2 is 2 times the first voltage V1 is added to the characteristic illustrated in FIG. 9A. In FIG. 12B, the characteristic when the second voltage V2 is 2 times the first voltage V1 is added to the characteristic illustrated in FIG. 9B.

As shown in FIG. 12A, when the second voltage V2 is 2 times the first voltage V1, compared to when the second voltage V2 is equal to the first voltage V1, the lower limit of the off-time difference Tdf in which the switching loss E1 is less than the reference value E0 is reduced. On the other hand, even when the second voltage V2 is changed, the upper limit of the off-time difference Tdf in which the switching loss E1 is less than the reference value E0 substantially does not change. When the second voltage V2 is greater than the first voltage V1, the range of the off-time difference Tdf in which the switching loss E1 is less than the reference value E0 is enlarged.

As shown in FIG. 12B, when the second voltage V2 is 2 times the first voltage V1, compared to when the second voltage V2 is equal to the first voltage V1, the lower limit of the on-time difference Tdn in which the switching loss E1 is less than the reference value E0 is reduced. On the other hand, even when the second voltage V2 changes, the upper limit of the on-time difference Tdn in which the switching loss E1 is less than the reference value E0 substantially does not change. When the second voltage V2 is greater than the first voltage V1, the range of the on-time difference Tdn in which the switching loss E1 is less than the reference value E0 is enlarged.

In the embodiment, the second voltage V2 may be greater than the first voltage V1. The switching loss E1 can be effectively suppressed.

Other examples of the semiconductor device according to the first embodiment will now be described. A description of portions similar to those of the semiconductor device 110 described above are omitted hereinbelow.

Figure 13:
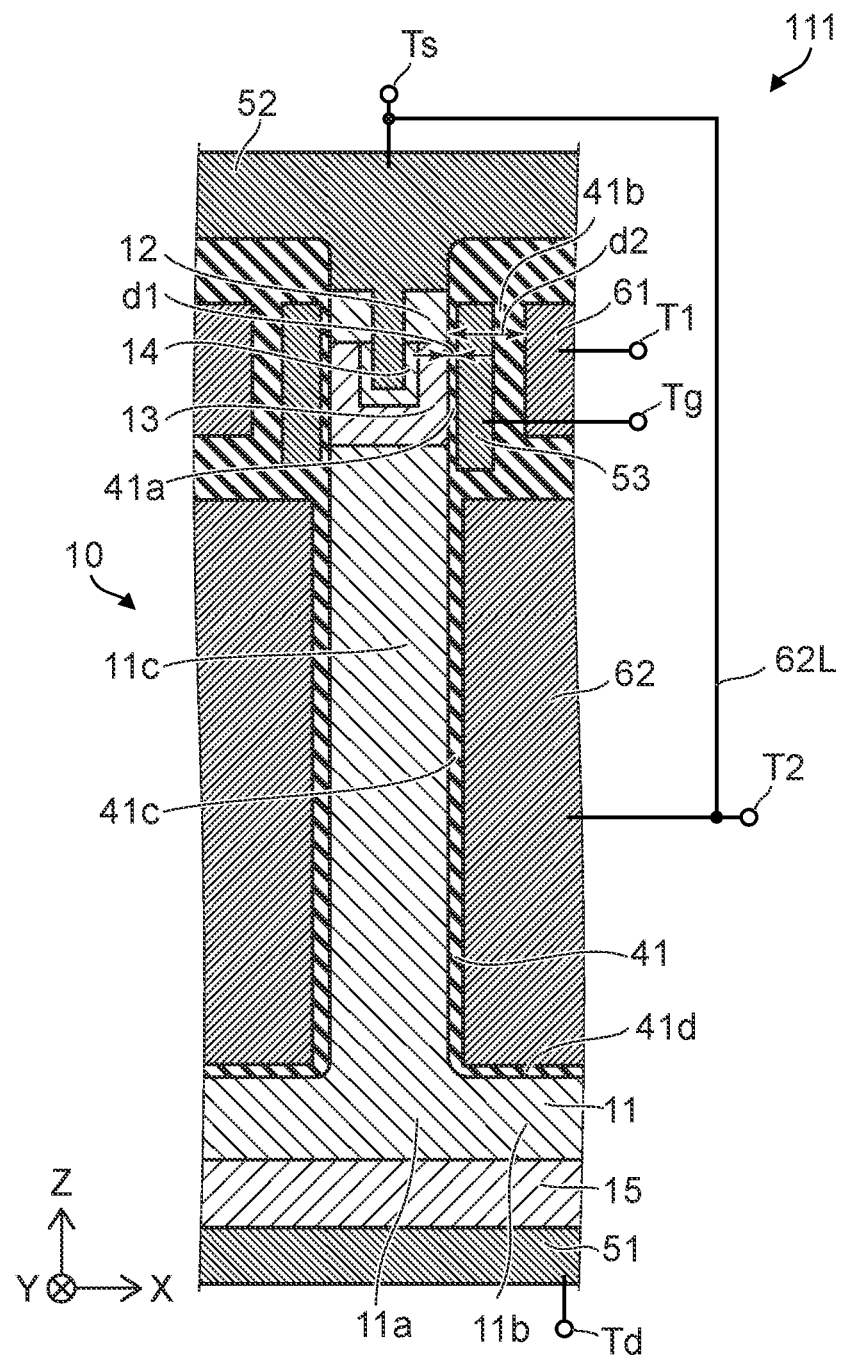
FIG. 13 is a schematic cross-sectional view illustrating a semiconductor device according to the first embodiment.

FIG. 13 is a schematic cross-sectional view illustrating a semiconductor device according to the first embodiment.

In the semiconductor device 111 according to the embodiment as shown in FIG. 13, the length (the width) along the X-axis direction of the second conductive member 62 is greater than the length (the width) along the X-axis direction of the gate electrode 53 and greater than the length (the width) along the X-axis direction of the first conductive member 61.

Figure 14:
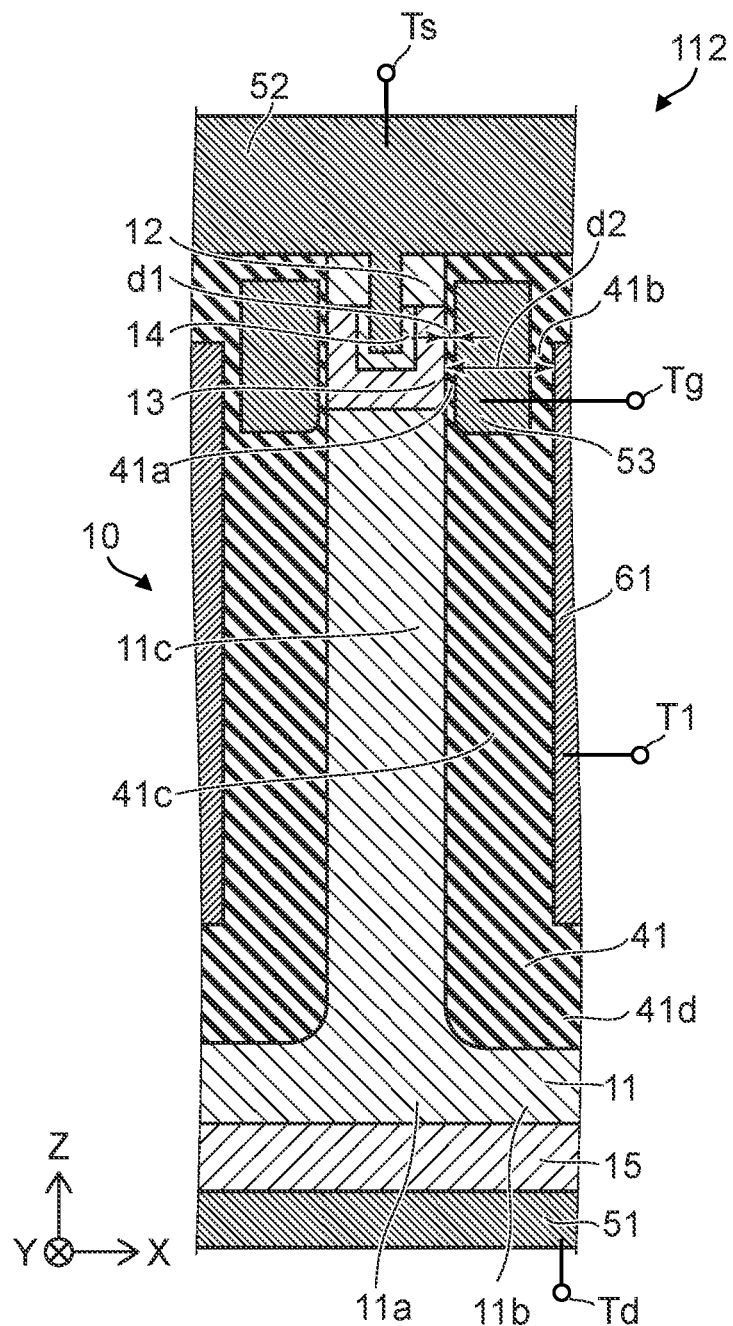
FIG. 14 is a schematic cross-sectional view illustrating a semiconductor device according to the first embodiment.

FIG. 14 is a schematic cross-sectional view illustrating a semiconductor device according to the first embodiment.

As shown in FIG. 14, the second conductive member 62 is not provided in the semiconductor device 112 according to the embodiment. The lower end of the first conductive member 61 is lower than the lower end of the gate electrode 53. The third insulating region 41c is between the third partial region 11c and a portion of the first conductive member 61 in the X-axis direction. In the example, the upper end of the first conductive member 61 is lower than the upper end of the gate electrode 53.

Figure 15:
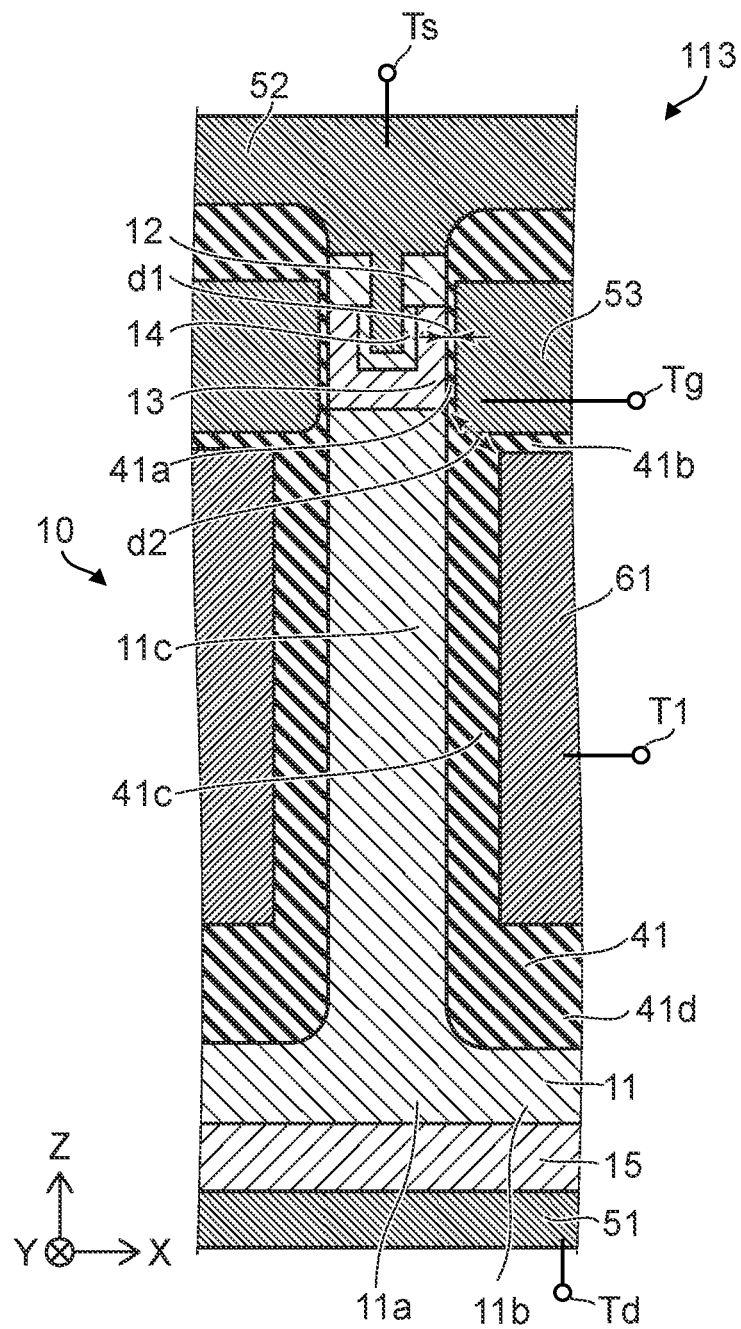
FIG. 15 is a schematic cross-sectional view illustrating a semiconductor device according to the first embodiment.

FIG. 15 is a schematic cross-sectional view illustrating a semiconductor device according to the first embodiment.

In the semiconductor device 113 according to the embodiment as shown in FIG. 15, the first conductive member 61 is between the second partial region 11b and the gate electrode 53 in the first direction (the Z-axis direction). Thus, in the embodiment, at least a portion of the first conductive member 61 may be between the second partial region 11b and the gate electrode 53 in the first direction.

Figure 16:
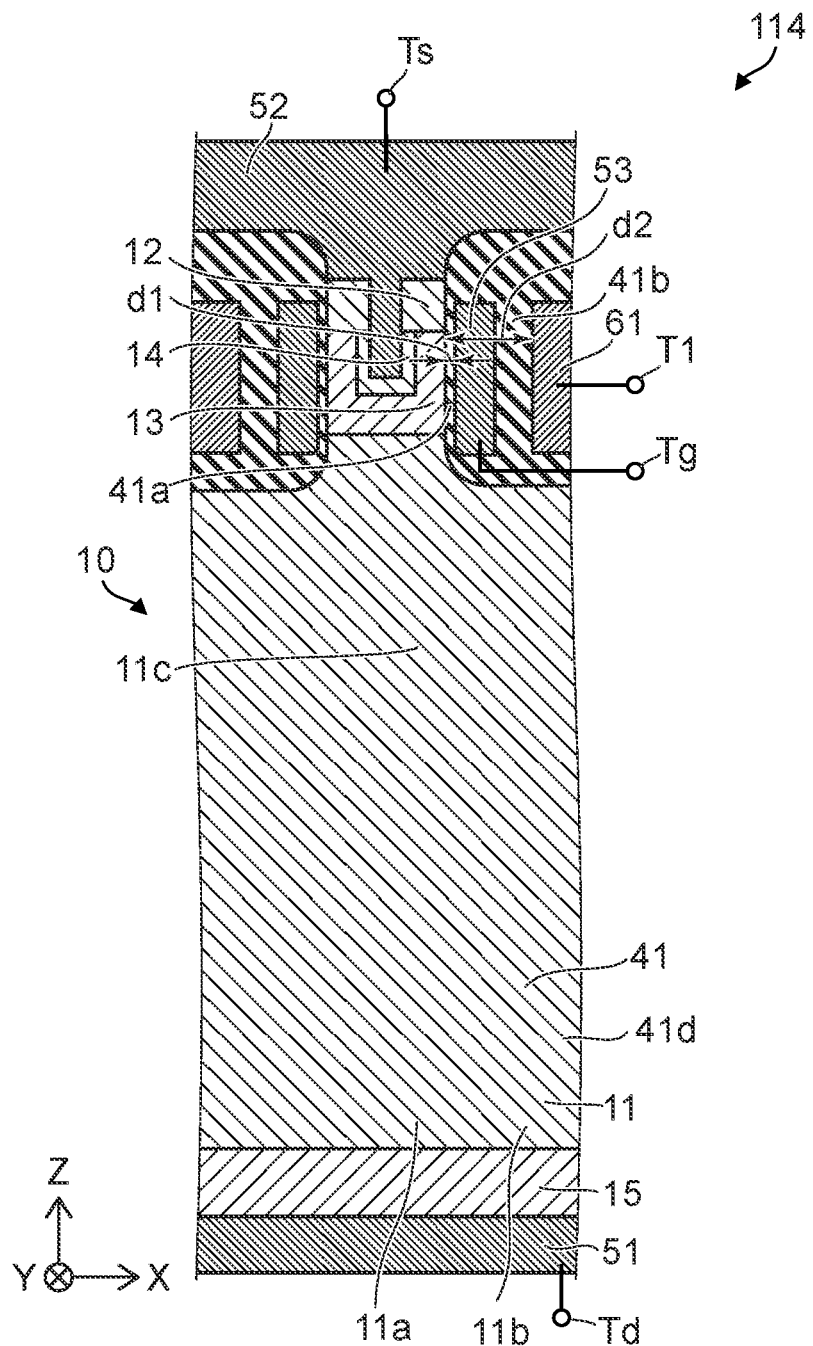
FIG. 16 is a schematic cross-sectional view illustrating a semiconductor device according to the first embodiment.

FIG. 16 is a schematic cross-sectional view illustrating a semiconductor device according to the first embodiment.

In the semiconductor device 114 according to the embodiment as shown in FIG. 16, at least a portion of the gate electrode 53 is between the third semiconductor region 13 and the first conductive member 61.

Figure 17:
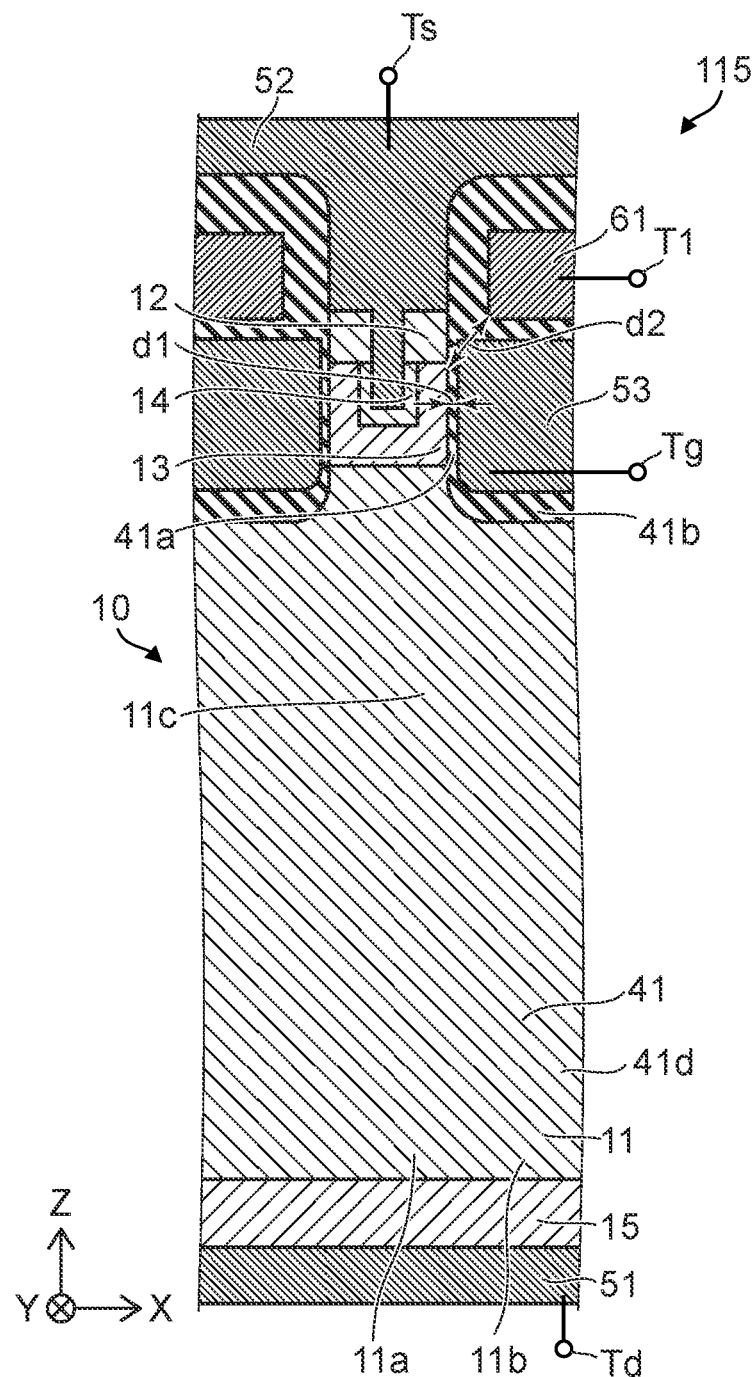
FIG. 17 is a schematic cross-sectional view illustrating a semiconductor device according to the first embodiment.

FIG. 17 is a schematic cross-sectional view illustrating a semiconductor device according to the first embodiment.

In the semiconductor device 115 according to the embodiment as shown in FIG. 17, the first conductive member 61 is between at least a portion of the gate electrode 53 and at least a portion of the second electrode 52 in the first direction (the Z-axis direction).

In the semiconductor devices 111 to 115 as well, the switching loss can be reduced. According to the embodiment, a semiconductor device can be provided in which the characteristics can be improved.

Second Embodiment

A description of portions similar to those of the semiconductor device 110 described above is omitted hereinbelow.

Figure 18:
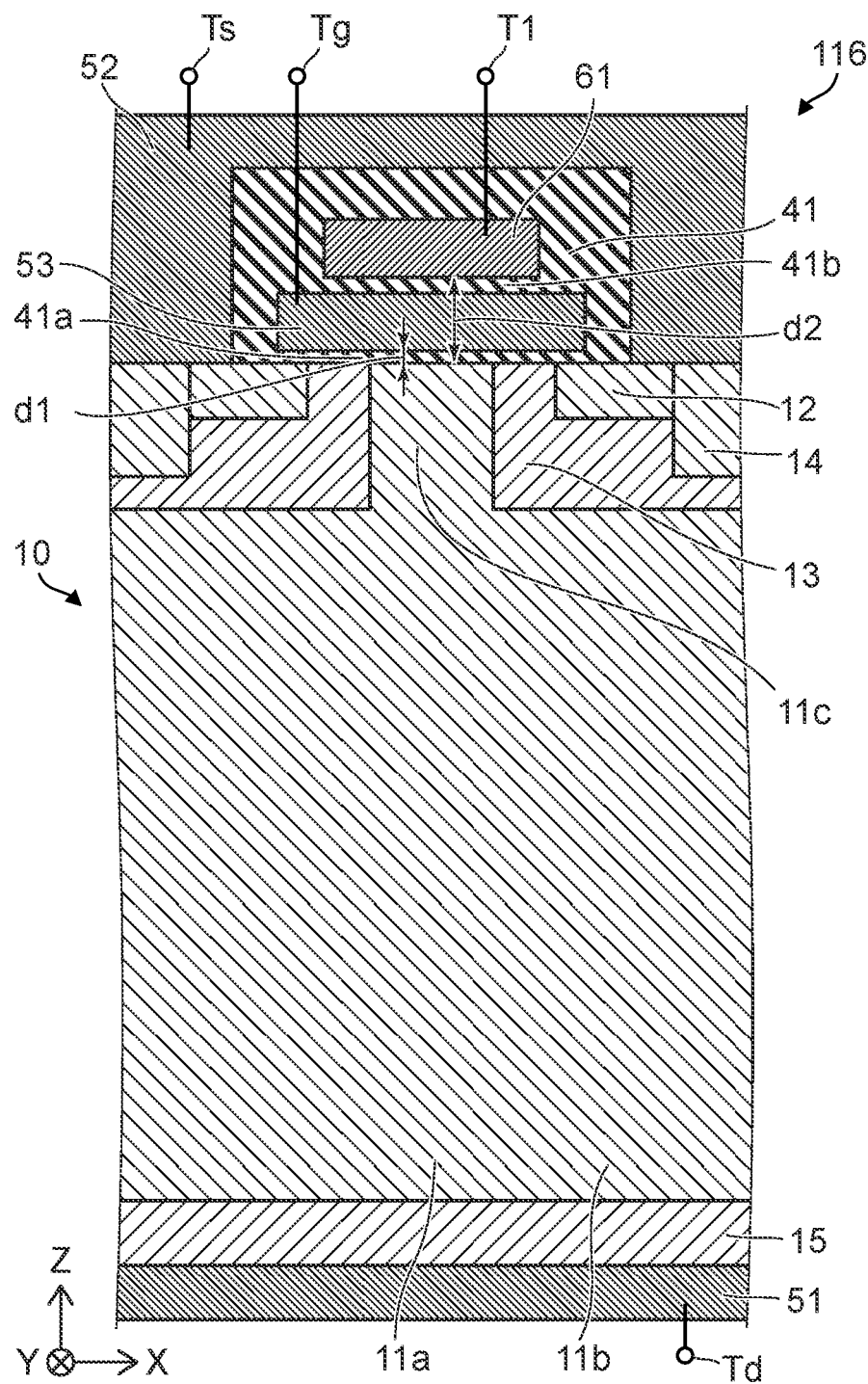
FIG. 18 is a schematic cross-sectional view illustrating a semiconductor device according to a second embodiment.

FIG. 18 is a schematic cross-sectional view illustrating a semiconductor device according to the second embodiment.

In the semiconductor device 116 according to the embodiment as shown in FIG. 18, the direction from the first electrode 51 toward the second electrode 52 is along the first direction (the Z-axis direction). The first semiconductor region 11 includes the first partial region 11a, the second partial region 11b, and the third partial region 11c. The direction from the first partial region 11a toward the second partial region 11b is along the second direction (e.g., the X-axis direction) crossing the first direction. The third partial region 11c is between the first partial region 11a and the first conductive member 61 in the first direction (the Z-axis direction). The gate electrode 53 is between the third partial region 11c and the first conductive member 61 in the first direction (the Z-axis direction). The third semiconductor region 13 is between the third partial region 11c and the second semiconductor region 12 in the second direction (the X-axis direction).

In the semiconductor device 116 as well, for example, the first electrical capacitance between the gate electrode 53 and the first electrode 51 is less than the second electrical capacitance between the gate electrode 53 and the first conductive member 61. In the semiconductor device 116 as well, similarly to the semiconductor device 110, the control circuit 70 described above may be provided. In the semiconductor device 116 as well, the switching loss can be reduced by the control described with reference to the semiconductor device 110. According to the embodiment, a semiconductor device can be provided in which the characteristics can be improved.

An example of a method for manufacturing the semiconductor device 111 will now be described as an example of a method for manufacturing the semiconductor devices according to the embodiments.

FIGS. 19 to 27 are schematic cross-sectional views illustrating the semiconductor device according to the embodiment.

Figure 19:
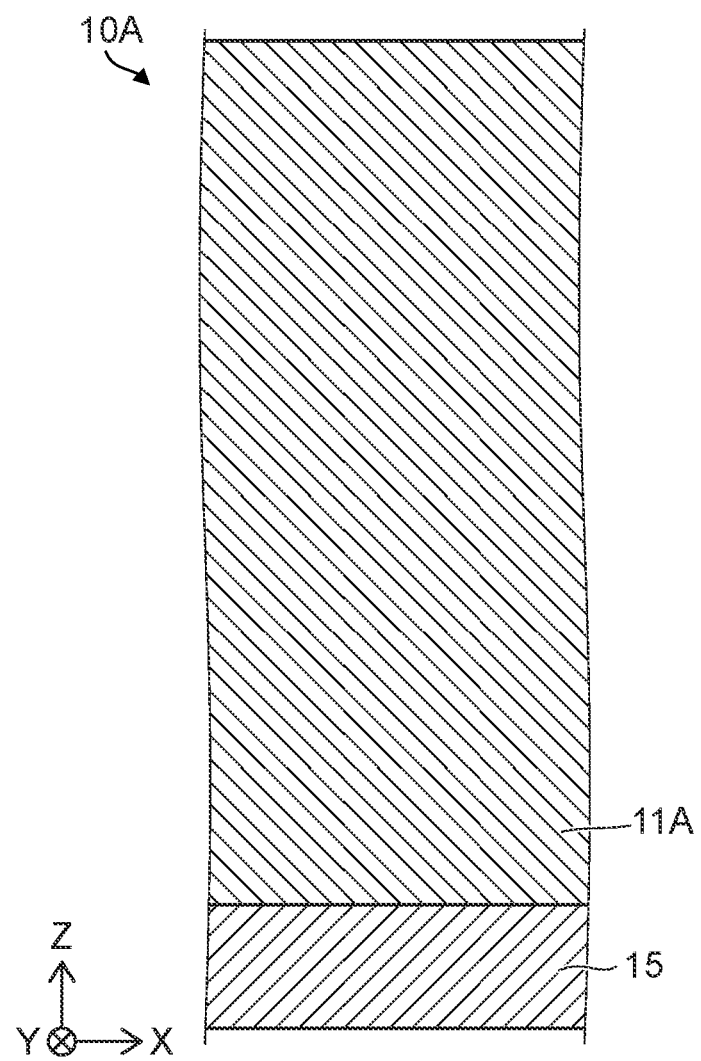
FIG. 19 is a schematic cross-sectional view illustrating the semiconductor device according to the embodiment.

A structure body 10A is prepared as shown in FIG. 19. The structure body 10A includes the fifth semiconductor region 15 and a region 11A that is used to form the first semiconductor region 11. The structure body 10A includes, for example, silicon.

Figure 20:
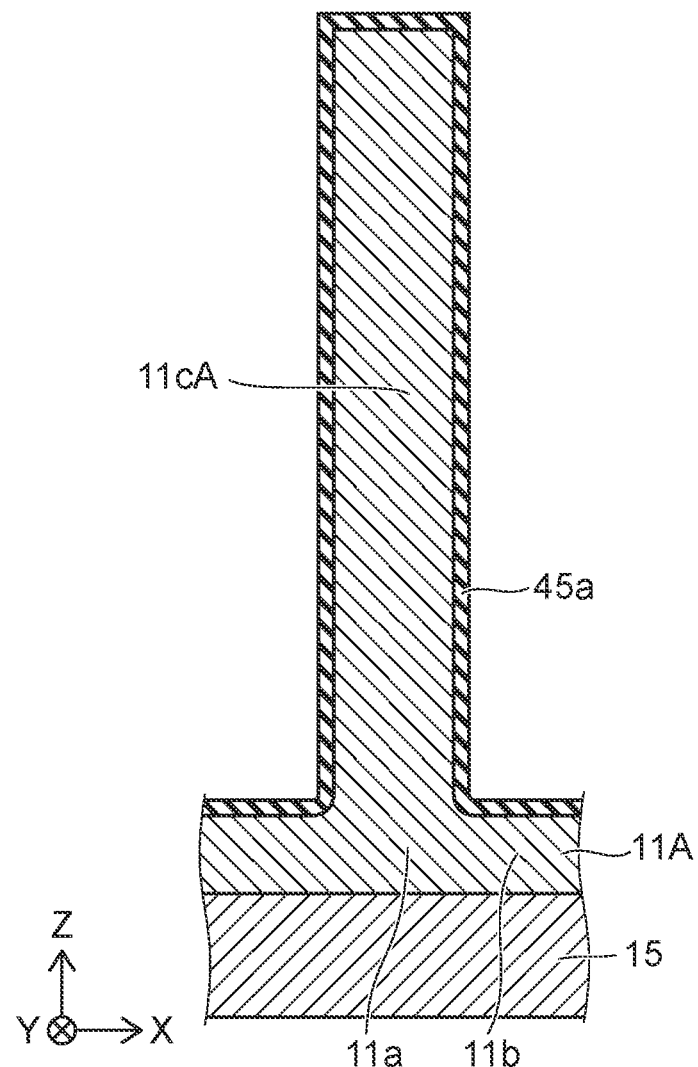
FIG. 20 is a schematic cross-sectional view illustrating the semiconductor device according to the embodiment.

As shown in FIG. 20, a region 11cA that is used to form the first partial region 11a, the second partial region 11b, and the third partial region 11c of the first semiconductor region 11 is formed by removing a portion of the region 11A. An insulating film 45a that is used to form a portion of the first insulating member 41 is formed. For example, the insulating film 45a can be formed by thermal oxidation.

Figure 21:
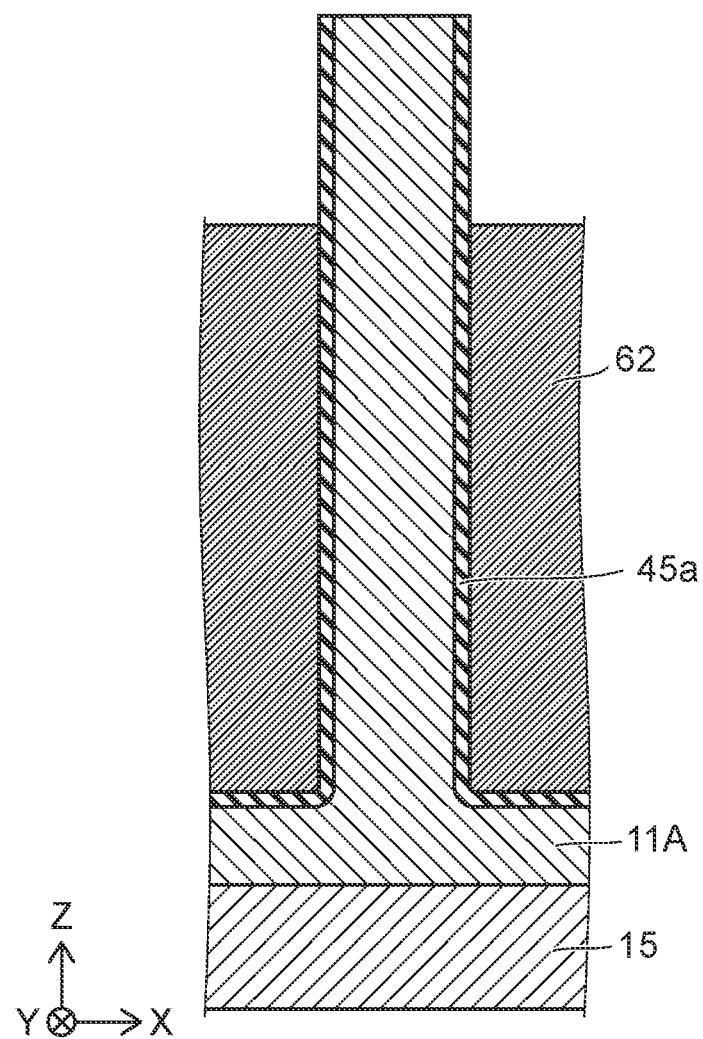
FIG. 21 is a schematic cross-sectional view illustrating the semiconductor device according to the embodiment.

As shown in FIG. 21, the second conductive member 62 is formed by, for example, forming a polysilicon film and subsequently removing a portion of the polysilicon film.

Figure 22:
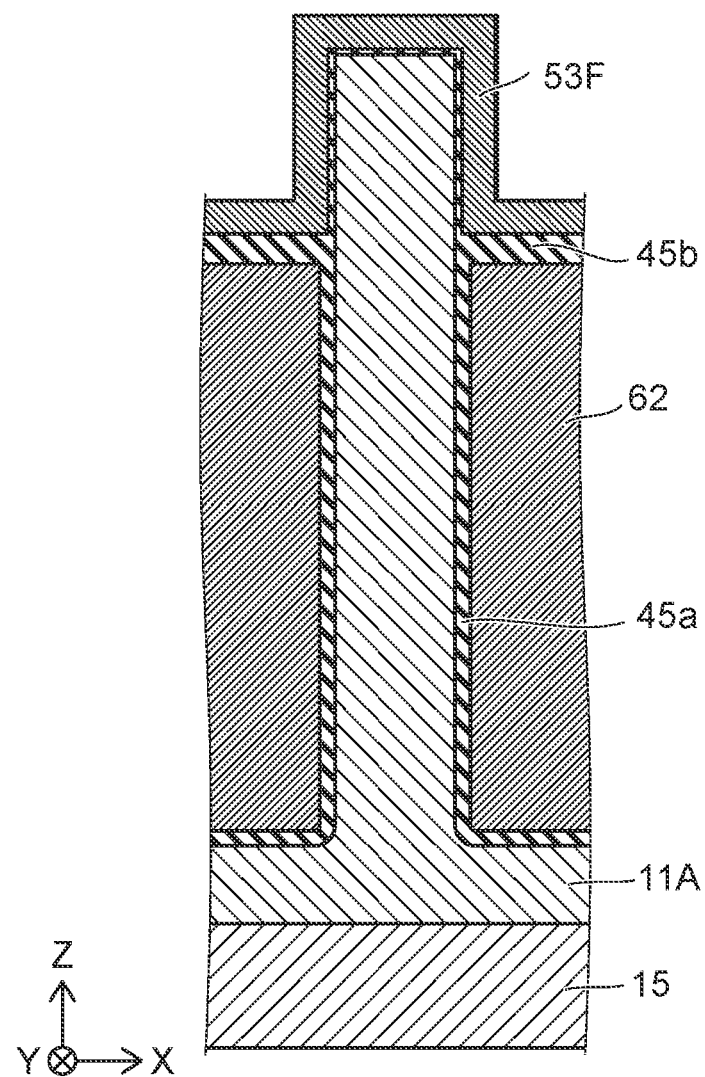
FIG. 22 is a schematic cross-sectional view illustrating the semiconductor device according to the embodiment.

As shown in FIG. 22, for example, an insulating film 45b (e.g., a silicon oxide film) is formed, and a conductive film 53F (e.g., a polysilicon film) that is used to form the gate electrode 53 is formed.

Figure 23:
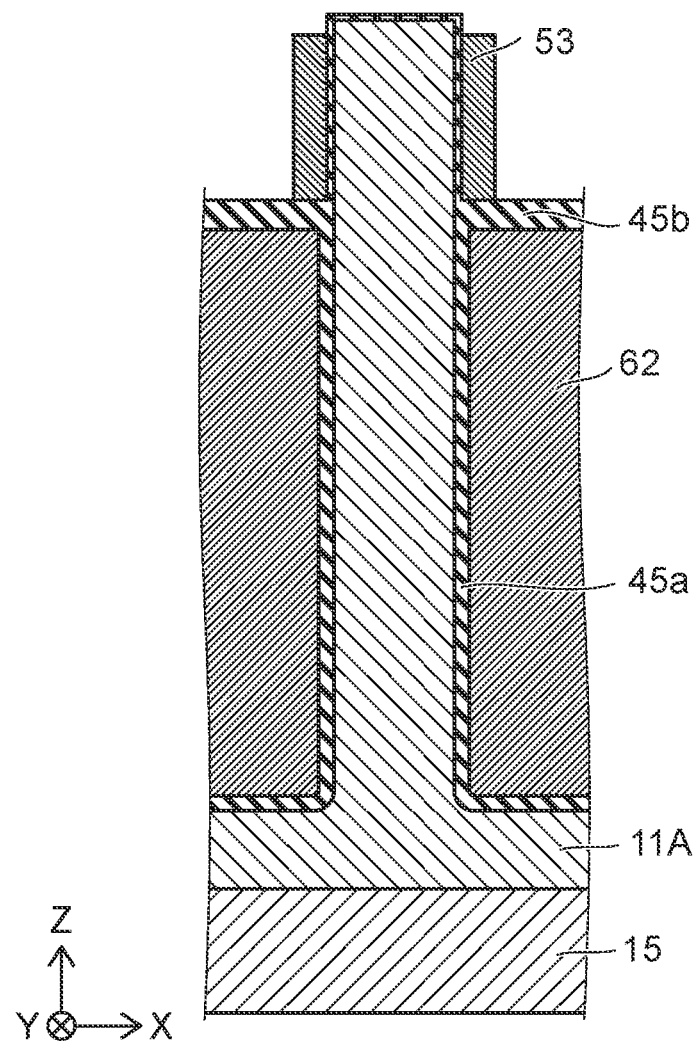
FIG. 23 is a schematic cross-sectional view illustrating the semiconductor device according to the embodiment.

As shown in FIG. 23, the gate electrode 53 is formed by removing a portion of the conductive film 53F.

Figure 24:
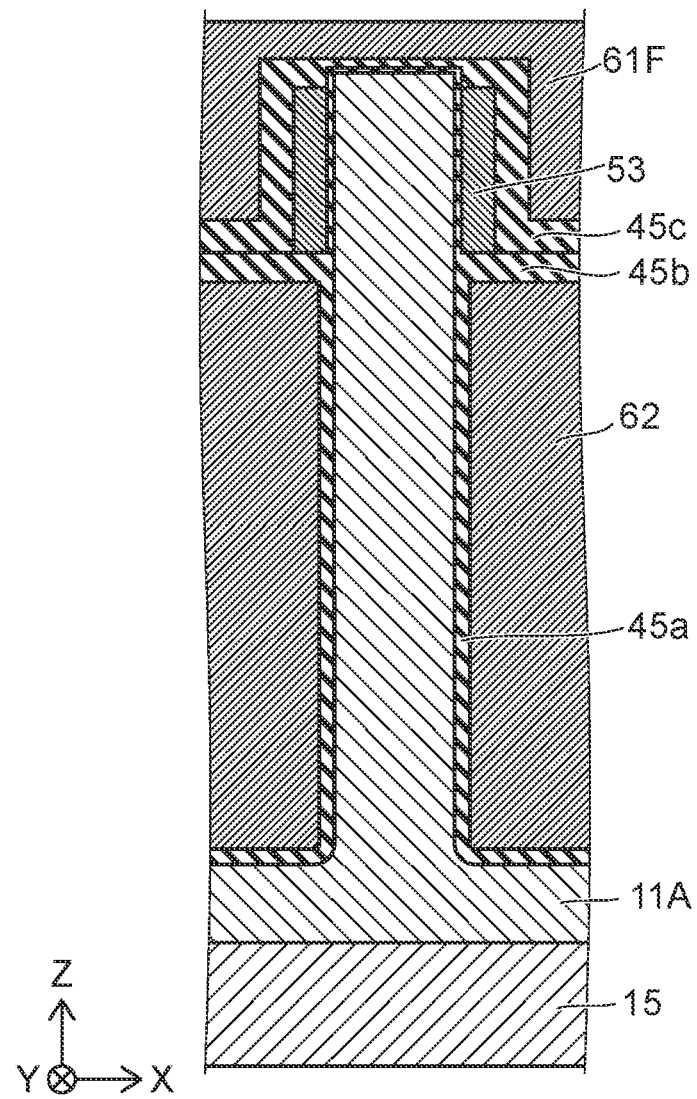
FIG. 24 is a schematic cross-sectional view illustrating the semiconductor device according to the embodiment.

As shown in FIG. 24, an insulating film 45c (e.g., a silicon oxide film) is formed, and a conductive film 61F (e.g., a polysilicon film) that is used to form the first conductive member 61 is formed.

Figure 25:
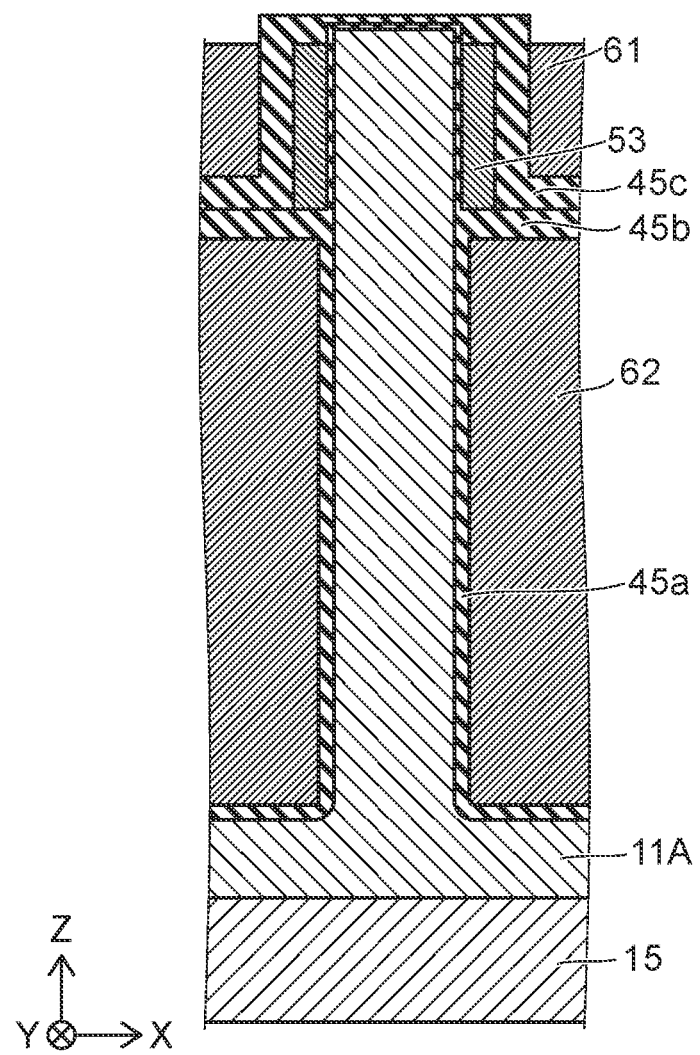
FIG. 25 is a schematic cross-sectional view illustrating the semiconductor device according to the embodiment.

As shown in FIG. 25, the first conductive member 61 is formed by removing a portion of the conductive film 61F.

Figure 26:
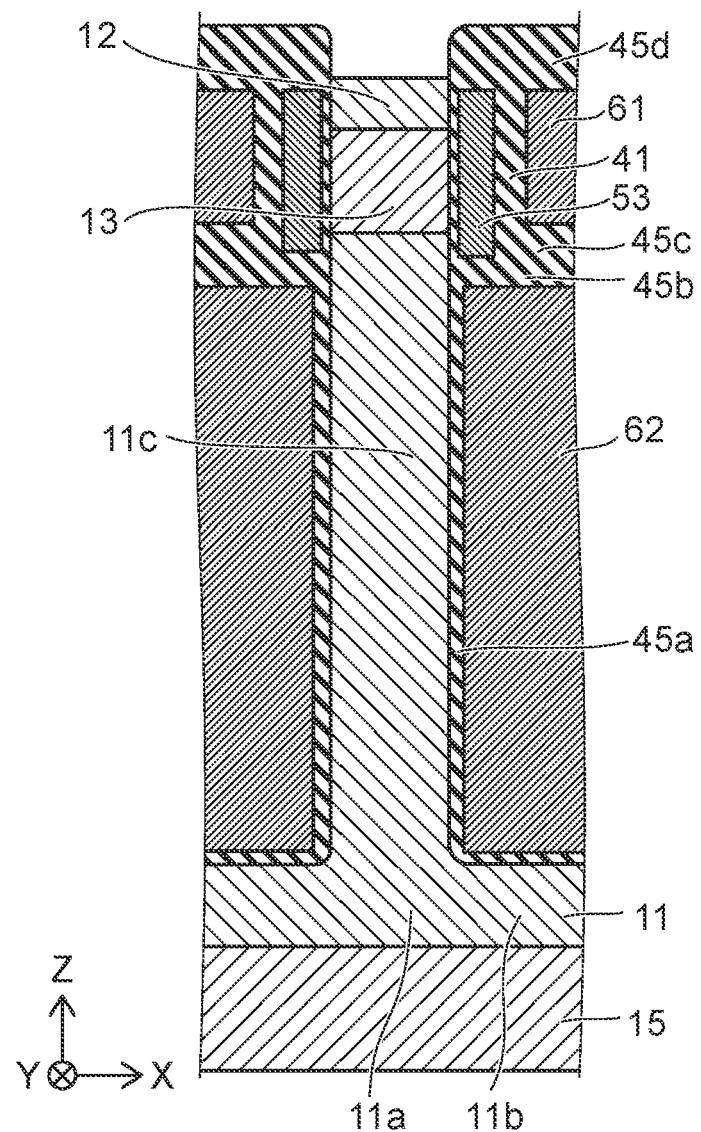
FIG. 26 is a schematic cross-sectional view illustrating the semiconductor device according to the embodiment.

As shown in FIG. 26, an insulating film 45d (e.g., a silicon oxide film) is formed on the gate electrode 53 and the first conductive member 61. The third partial region 11c, the third semiconductor region 13, and the second semiconductor region 12 are formed by, for example, introducing a p-type impurity (e.g., boron) and by introducing an n-type impurity (e.g., phosphorus) to a portion of the region 11cA. Subsequently, a contact hole is formed by removing a portion of the second semiconductor region 12 and a portion of the third semiconductor region 13. A p-type impurity is introduced to the contact hole portion.

Figure 27:
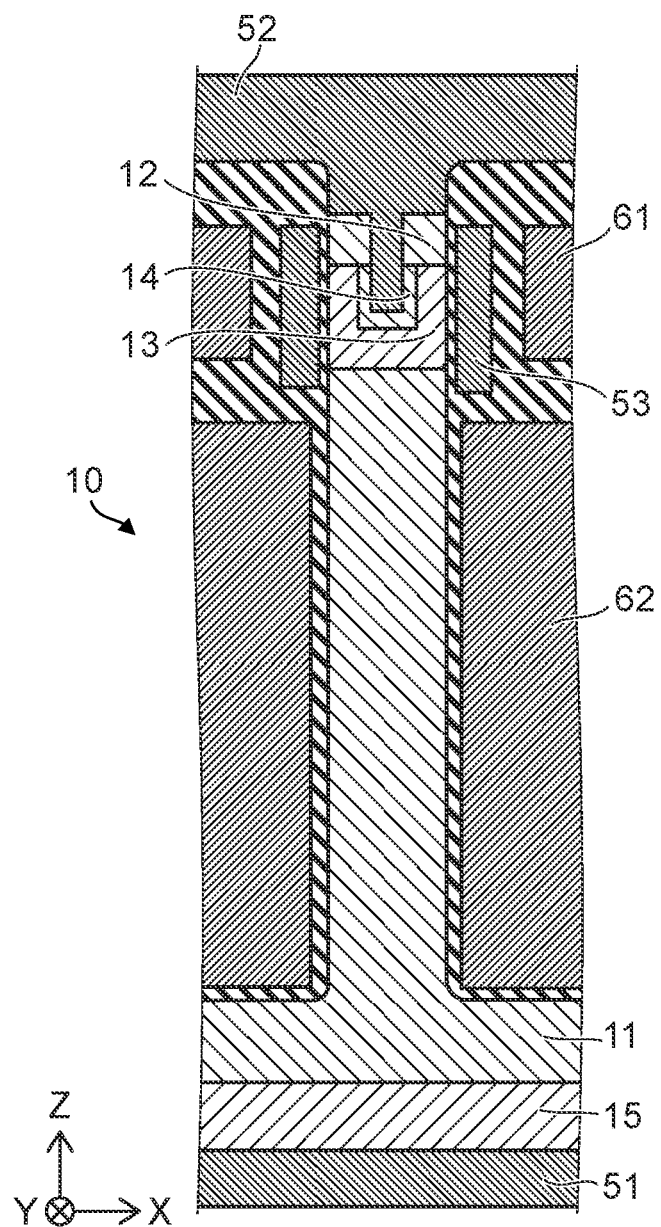
FIG. 27 is a schematic cross-sectional view illustrating the semiconductor device according to the embodiment.

Thereby, the fourth semiconductor region 14 is formed as shown in FIG. 27. Subsequently, the second electrode 52 and the first electrode 51 are formed. The semiconductor device 111 is obtained thereby.

According to the embodiments, a semiconductor device can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, conductive members, semiconductor regions, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor member including
      a first semiconductor region of a first conductivity type,
      a second semiconductor region of the first conductivity type, and
      a third semiconductor region provided between the first semiconductor region and the second semiconductor region, the third semiconductor region being of a second conductivity type;
   a first electrode electrically connected to the first semiconductor region;
   a second electrode electrically connected to the second semiconductor region;
   a gate electrode;
   a gate terminal electrically connected to the gate electrode;
   a first conductive member electrically insulated from the first electrode, the second electrode, and the gate electrode, a first distance between the gate electrode and the third semiconductor region being less than a second distance between the first conductive member and the third semiconductor region;
   a first terminal electrically connected to the first conductive member; and
   a first insulating member including
      a first insulating region between the third semiconductor region and the gate electrode, and
      a second insulating region between the gate electrode and the first conductive member;
   a second signal being inputtable to the first terminal and being switched at a different timing from a first signal input to the gate terminal; and
   a second conductive member,
   wherein
   a direction from the first electrode toward the second electrode is along a first direction,
   the first semiconductor region includes a first partial region a second partial region, and a third partial region,
   a direction from the first partial region toward t second partial region is along a second direction crossing the first direction,
   the second direction is along a face of the first electrode opposite to the first semiconductor region,
   the third partial region is between the first partial region and the second semiconductor region in the first direction,
   the third semiconductor re on is between the third partial region and the second semiconductor region in the first direction,
   a direction from the third semiconductor region toward the gate electrode is along the second direction,
   at least a portion of the gate electrode is between the second partial region and the second electrode in the first direction,
   in the second direction, the gate electrode is between the third partial region and the first conductive member,
   a direction from a portion of the third partial region toward the second conductive member is along the second direction,
   in the first direction, the second conductive member is between the second partial region avid the gate electrode,
   in the first direction, the second conductive member is between the second partial region and the first conductive member,
   the first insulating member includes a third insulating region and a fourth insulating region,
   the third insulating region is between the third partial region and the second conductive member in the second direction,
   the fourth insulating region is between the second partial region and the second conductive member in the first direction,
   the second conductive member is electrically connected to the second electrode or electrically connectable to the second electrode, and
   at least a portion of the gate electrode is located between the third semiconductor region and the first conductive member in the second direction.

2. The device according to claim 1, wherein
a first electrical capacitance between the gate electrode and the first electrode is less than a second electrical capacitance between the gate electrode and the first conductive member.
3. The device according to claim 1, wherein
at least a portion of the first conductive member is between the first electrode and the second electrode.
4. The device according to claim 1, wherein
the third insulating region is between the third partial region and at least a portion of the first conductive member in the second direction.

* * * * *